US012782460B2

(12) United States Patent
Wang et al.

(10) Patent No.: US 12,782,460 B2
(45) Date of Patent: Nov. 3, 2026

(54) INSPECTION CIRCUIT AND METHOD

(71) Applicant: CONTEMPORARY AMPEREX TECHNOLOGY (HONG KONG) LIMITED, Hong Kong (CN)

(72) Inventors: Haijie Wang, Ningde (CN); Xueqing Gong, Ningde (CN); Guangwei Zhou, Ningde (CN); Jiawu Cheng, Ningde (CN); Jiacai Wang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 309 days.

(21) Appl. No.: 18/422,895

(22) Filed: Jan. 25, 2024

(65) Prior Publication Data

US 2024/0426936 A1 Dec. 26, 2024

Related U.S. Application Data

(63) Continuation of application No. PCT/CN2023/101935, filed on Jun. 21, 2023.

(51) Int. Cl.
*G01R 31/396* (2019.01)
*G01R 31/14* (2006.01)
(Continued)

(52) U.S. Cl.
CPC ........... *G01R 31/396* (2019.01); *G01R 31/14* (2013.01); *G01R 31/3835* (2019.01); *H02H 9/02* (2013.01)

(58) Field of Classification Search
CPC .. G01R 31/396; G01R 31/14; G01R 31/3835; G01R 31/50; G01R 31/3865; H02H 9/02;
(Continued)

(56) References Cited

U.S. PATENT DOCUMENTS 3,780,274 A * 12/1973 Thompson .............. H03M 1/38 341/126
4,397,021 A * 8/1983 Lloyd .............. G01R 31/31907 714/33
(Continued)

FOREIGN PATENT DOCUMENTS

CN 102411115 A 4/2012
CN 202886539 U 4/2013
(Continued)

OTHER PUBLICATIONS

Hioki Battery Insulation Tester BT5525, Product Brochure, Feb. 14, 2022, available at https://hioki.co.id/wp-content/uploads/2022/04/1.pdf (Year: 2022).*

(Continued)

*Primary Examiner* — Daniel R Miller
(74) *Attorney, Agent, or Firm* — ANOVA LAW GROUP, PLLC

(57) ABSTRACT

An inspection circuit includes a plurality of inspection devices and a plurality of pathway switching circuits. Input ends of the pathway switching circuits are respectively connected to different test lines. The test lines are connected to a test terminal corresponding to a battery cell under test. Output ends of the pathway switching circuits are respectively connected to the plurality of inspection devices. The pathway switching circuit is configured to connect, according to an inspection signal, an inspection device corresponding to the inspection signal and a test terminal corresponding to the battery cell under test. The inspection device is configured to obtain an inspection result of the battery cell under test.

20 Claims, 18 Drawing Sheets

(51) Int. Cl.
*G01R 31/3835* (2019.01)
*H02H 9/02* (2006.01)

(58) Field of Classification Search
CPC .......... H01M 10/4207; H01M 10/4285; Y02E 60/10
See application file for complete search history.

(56) References Cited

U.S. PATENT DOCUMENTS

| | | | | |
|---|---|---|---|---|
| 4,760,330 | A * | 7/1988 | Lias, Jr. | G01R 31/31926 714/32 |
| 5,036,479 | A * | 7/1991 | Prednis | G01D 18/00 714/732 |
| 2007/0146151 | A1 | 6/2007 | Yamashita et al. | |
| 2009/0128173 | A1* | 5/2009 | Wong | G01R 31/2834 324/750.3 |
| 2011/0181117 | A1 | 7/2011 | Goja et al. | |
| 2013/0320991 | A1 | 12/2013 | Kiuchi | |
| 2022/0018909 | A1 | 1/2022 | Iijima | |
| 2024/0402257 | A1* | 12/2024 | Lee | G01R 31/386 |

FOREIGN PATENT DOCUMENTS

| | | | |
|---|---|---|---|
| CN | 210803677 | U | 6/2020 |
| CN | 111751689 | A | 10/2020 |
| CN | 112014760 | A | 12/2020 |
| CN | 212540654 | U | 2/2021 |
| CN | 214174592 | U | 9/2021 |
| CN | 113490355 | A | 10/2021 |
| CN | 113985304 | A | 1/2022 |
| CN | 215867073 | U | 2/2022 |
| CN | 114460392 | A | 5/2022 |
| CN | 115184822 | A | 10/2022 |
| CN | 115792657 | A | 3/2023 |
| CN | 115940339 | A | 4/2023 |
| EP | 2637028 | A1 | 9/2013 |
| GB | 1448876 | A | 9/1976 |
| JP | 2019198195 | A | 11/2019 |
| WO | 2022110606 | A1 | 6/2022 |

OTHER PUBLICATIONS

The World Intellectual Property Organization (WIPO) International Search Report for PCT/CN2023/101935 Dec. 11, 2023 7 pages (including English translation).
The European Patent Office (EPO) The Extended European Search Report for Applicatio No. 23840864.5, Aug. 29, 2024, 10 Pages.
China National Intellectual Property Administration (CNIPA), The First Office Action for Application No. 202380060047.4, Jan. 6, 2026, 11 Pages (including translation).

* cited by examiner

INSPECTION CIRCUIT AND METHOD

CROSS-REFERENCE TO RELATED APPLICATION

This application is a continuation of International Application No. PCT/CN2023/101935, filed on Jun. 21, 2023, the entire content of which is incorporated herein by reference.

TECHNICAL FIELD

This application relates to the field of battery inspection technologies, and in particular, to an inspection circuit and method.

BACKGROUND

During actual production process of batteries, for different battery product types, there may be positive poles and negative poles. There is a need to perform inspection on the batteries, and the inspection process cannot be automated.

SUMMARY

Embodiments of this application propose an inspection circuit and method, aiming to solve the technical problem of being unable to automate the inspection of batteries.

According to a first aspect, an embodiment of this application proposes an inspection circuit, where the inspection circuit includes a plurality of inspection devices and a plurality of pathway switching circuits; input ends of the pathway switching circuits are respectively connected to different test lines; the test lines are connected to a test terminal corresponding to a battery cell under test; and output ends of the pathway switching circuits are respectively connected to the plurality of inspection devices.

The pathway switching circuit is configured to connect, according to an inspection signal, an inspection device corresponding to the inspection signal and a test terminal corresponding to the battery cell under test.

The inspection device is configured to obtain an inspection result of the battery cell under test.

In this embodiment, a plurality of inspection devices and a plurality of pathway switching circuits are disposed in an inspection circuit. Input ends of the pathway switching circuits are respectively connected to different test lines. The test lines are connected to a test terminal corresponding to a battery cell under test. Output ends of the pathway switching circuits are respectively connected to the plurality of inspection devices. The pathway switching circuit is configured to connect, according to an inspection signal, an inspection device corresponding to the inspection signal and a test terminal corresponding to the battery cell under test. The inspection device is configured to obtain an inspection result of the battery cell under test. According to the inspection signal, the corresponding inspection device can be automatically switched to, so that inspection is performed on the battery cell under test. Thus, inspection of the battery cell under test is automated.

In some embodiments, the inspection device includes an insulation inspection device and a voltage inspection device; a plurality of battery cells under test are present; and the pathway switching circuit includes an insulation test path and a voltage test path.

An input end of the insulation test path is connected to test terminals corresponding to the positive electrodes of the plurality of the battery cells under test, and an output end of the insulation test path is connected to the insulation inspection device.

An input end of the voltage test path is connected to test terminals corresponding to positive electrodes of the battery cells under test and test terminals corresponding to negative electrodes of the battery cells under test, and an output end of the voltage test path is connected to the voltage inspection device.

The insulation inspection device is configured to obtain an insulation inspection result of the battery cells under test with the insulation test path is connected.

The voltage inspection device is configured to obtain a voltage inspection result of the battery cells under test with the voltage test path is connected.

In the technical solution of the embodiments of this application, the insulation inspection device and the voltage inspection device are provided as the inspection device. A different inspection device is connected to a corresponding test path. The corresponding inspection device can inspect the battery cell under test to obtain an inspection result with the corresponding test path connected. The voltage and insulation of the battery cell under test can be inspected separately, adapting to the different inspection types for the battery cell under test, and expanding the scope of the inspection of the battery cell under test.

In some embodiments, the insulation test path includes a first insulation test path and a second insulation test path, and the plurality of battery cells under test include a first battery cell under test and a second battery cell under test, the first battery cell under test and the second battery cell under test being independent of each other.

An input end of the first insulation test path is connected to a test terminal corresponding to a positive electrode of the first battery cell under test; and an output end of the first insulation test path is connected to the insulation inspection device.

An input end of the second insulation test path is connected to a test terminal corresponding to a positive electrode of the second battery cell under test, and an output end of the second insulation test path is connected to the insulation inspection device.

In the technical solution of the embodiments of this application, when an inspection result is obtained by performing insulation inspection on the battery cell under test by the insulation inspection device, the insulation test path is divided into the first insulation test path and the second insulation test path, so as to simultaneously perform insulation inspection between the positive electrode of the first battery cell under test and the positive electrode of the second battery cell under test. Compared to manual testing of insulation between battery cells under test, which has the problem of missed testing, this application can realize self-checking of the insulation inspection circuit during the inspection, thereby improving the accuracy and completeness of the inspection.

In some embodiments, the pathway switching circuit further includes a first switch array and a second switch array.

The first switch array is disposed in the first insulation test path, an input end of the first switch array is connected to the test terminal corresponding to the positive electrode of the first battery cell under test, and an output end of the first switch array is connected to the insulation inspection device;

The second switch array is disposed in the second insulation test path, an input end of the second switch array is connected to the test terminal corresponding to the positive electrode of the second battery cell under test, and an output end of the second switch array is connected to the insulation inspection device.

The first switch array and the second switch array are configured to be closed during insulation test of the first battery cell under test and the second battery cell under test, simultaneously connecting the test terminal corresponding to the positive electrode of the first battery cell under test to the insulation inspection device and the test terminal corresponding to the positive electrode of the second battery cell under test to the insulation inspection device.

In the technical solution of the embodiments of this application, the first switch array and the second switch array are disposed in the pathway switching circuit. The first switch array is disposed in the first insulation test path, and the second switch array is disposed in the second insulation test path, and they are closed during insulation test between the positive electrodes of the first battery cell under test and the second battery cell under test, implementing a design compatible with the insulation test circuit between positive electrodes of the battery cells under test.

In some embodiments, the voltage test path includes a first voltage test path and a second voltage test path.

An input end of the first voltage test path is connected to first test terminals corresponding to the positive electrodes of the battery cells under test, and an output end of the first voltage test path is connected to the voltage inspection device.

An input end of the second voltage test path is connected to first test terminals corresponding to the negative electrodes of the battery cells under test, and an output end of the second voltage test path is connected to the voltage inspection device.

In the technical solution of the embodiments of this application, the first voltage test path and the second voltage test path are disposed in the voltage test path. The first voltage test path is connected to the test terminals corresponding to the positive electrodes of battery cells under test. The second voltage test path is connected to the test terminals corresponding to the negative electrodes of the battery cells under test. Thus, a voltage inspection circuit is formed between the first voltage test path, the second voltage test path, the positive and negative electrodes of the battery cells under test, and the voltage inspection device, implementing automated voltage inspection of the battery cells under test.

In some embodiments, the pathway switching circuit further includes a third switch array and a fourth switch array.

The third switch array is disposed in the first voltage test path, an input end of the third switch array is connected to the first test terminals corresponding to the positive electrodes of the first battery cells under test, and an output end of the third switch array is connected to the voltage inspection device.

The fourth switch array is disposed in the second voltage test path, an input end of the fourth switch array is connected to the first test terminals corresponding to the negative electrodes of the first battery cells under test, and an output end of the fourth switch array is connected to the voltage inspection device.

The third switch array and the fourth switch array are configured to be closed during voltage test of the battery cells under test, connecting the first test terminals corresponding to the positive electrodes of the battery cells under test to the voltage inspection device and the first test terminals corresponding to the negative electrodes of the battery cells under test to the voltage inspection device.

In the technical solution of the embodiments of this application, the third switch array and the fourth switch array are further disposed in the pathway switching circuit. The third switch array is disposed in the first voltage test path, and the fourth switch array is disposed in the second voltage test path, and they are closed during voltage test between the positive and negative electrodes of the battery cells under test, implementing automated test of the voltage between positive and negative electrodes of the battery cells under test.

In some embodiments, the pathway switching circuit further includes a multiplexing path.

The input end of the insulation test path and the input end of the voltage test path are simultaneously connected to the test terminals corresponding to the positive electrodes of the battery cells under test both through the multiplexing path.

In the technical solution of the embodiments of this application, the multiplexing path is further disposed in the pathway switching circuit, so that insulation inspection and voltage inspection of the battery cells under test can be implemented simultaneously through connection by the multiplexing path, thus improving the inspection efficiency.

In some embodiments, the inspection device further includes a continuity inspection device, and the pathway switching circuit further includes a continuity test path.

An input end of the continuity test path is connected to second test terminals corresponding to the positive electrodes of the battery cells under test through the multiplexing path, the input end of the continuity test path is also connected to second test terminals corresponding to the negative electrodes of the battery cells under test, and an output end of the continuity test path is connected to the continuity inspection device.

The continuity inspection device is configured to obtain a continuity inspection result of the battery cells under test with the continuity test path connected.

In the technical solution of the embodiments of this application, the continuity inspection device and the corresponding continuity test path are further disposed in the inspection circuit, so that a continuity test can be performed between the positive and negative electrodes of the battery cells under test. The voltage and continuity test of the battery cells under test can be performed synchronously, shortening the testing time of the battery cells under test.

In some embodiments, the continuity test path includes a first continuity test path and a second continuity test path.

An input end of the first continuity test path is connected to second test terminals corresponding to the positive electrodes of the battery cells under test through the multiplexing path, and an output end of the first continuity test path is connected to the continuity inspection device.

An input end of the second continuity test path is connected to second test terminals corresponding to the negative electrodes of the battery cells under test, and an output end of the second continuity test path is connected to the continuity inspection device.

In the technical solution of the embodiments of this application, the first continuity test path and the second continuity test path are disposed in the continuity test path. The first continuity test path is connected to the test terminals corresponding to the positive electrodes of the battery cells under test. The second continuity test path is connected to the test terminals corresponding to the negative electrodes of the battery cells under test. Thus, a continuity inspection circuit is formed between the first continuity test path, the second continuity test path, the positive and negative electrodes of the battery cells under test, and the continuity inspection device, implementing automated continuity inspection of the battery cell under test.

In some embodiments, the pathway switching circuit further includes a fifth switch array and a sixth switch array.

The fifth switch array is disposed in the first continuity test path, an input end of the fifth switch array is connected to the second test terminals corresponding to the positive electrodes of the battery cells under test through the multiplexing path, and an output end of the fifth switch array is connected to the continuity inspection device.

The sixth switch array is disposed in the second continuity test path, an input end of the sixth switch array is connected to the second test terminals corresponding to the negative electrodes of the battery cells under test, and an output end of the sixth switch array is connected to the continuity inspection device.

The fifth switch array and the sixth switch array are configured to be closed during continuity test of the battery cells under test, connecting the second test terminals corresponding to the positive electrodes of the battery cells under test to the continuity inspection device and the second test terminals corresponding to the negative electrodes of the battery cells under test to the continuity inspection device.

In the technical solution of the embodiments of this application, the fifth switch array and the sixth switch array are further disposed in the pathway switching circuit. The fifth switch array is disposed in the first continuity test path, and the sixth switch array is disposed in the second continuity test path, and they are closed during continuity test between the positive and negative electrodes of the battery cells under test, implementing automated test of the continuity between another group of positive and negative electrodes of the battery cells under test.

In some embodiments, the pathway switching circuit further includes a seventh switch array.

The seventh switch array is disposed in the multiplexing path, an input end of the seventh switch array is connected to the test terminals corresponding to the positive electrodes of the battery cells under test, and an output end of the seventh switch array is connected to the input end of the insulation test path, the input end of the voltage test path, and the input end of the continuity test path.

The seventh switch array is closed during inspection of the battery cells under test, connecting the test terminals corresponding to the positive electrodes of the battery cells under test and a corresponding test path.

In the technical solution of the embodiments of this application, the seventh switch array is disposed in the multiplexing path, so that continuity of the multiplexing path can be controlled through the seventh switch array.

In some embodiments, the pathway switching circuit further includes an inspection switching path, and the battery cells under test include a first group of battery cells under test and a second group of battery cells under test.

An input end of the inspection switching path is connected to test terminals corresponding to the first group of battery cells under test and test terminals corresponding to the second group of battery cells under test, and an output end of the inspection switching path is connected to the inspection device.

The inspection switching path is configured to connect the test terminals corresponding to the first group of battery cells under test to the inspection device when the first group of battery cells under test are being inspected.

The inspection switching path is also configured to connect the test terminals corresponding to the second group of battery cells under test to the inspection device when the second group of battery cells under test are being inspected.

In the technical solution of the embodiments of this application, the inspection switching path can be used to switch the state of connectivity between the test terminal corresponding to a different group of battery cells under test and the inspection device, improving the inspection efficiency.

In some embodiments, the inspection switching path includes a first inspection switching path and a second inspection switching path.

An input end of the first inspection switching path is connected to the test terminals corresponding to the first group of battery cells under test; and an output end of the first inspection switching path is connected to the inspection device.

An input end of the second inspection switching path is connected to the test terminals corresponding to the second group of battery cells under test; and an output end of the second inspection switching path is connected to the inspection device.

In the technical solution of the embodiments of this application, the first inspection switching path and the second inspection switching path are disposed in the inspection switching path. The input end of the first inspection switching path is connected to the test terminals corresponding to the first group of battery cells under test, and the output end is connected to the inspection device. Therefore, when inspection is to be performed on the first group of battery cells under test, switching is performed to connect the test terminals corresponding to the first group of battery cells under test to the inspection device. The input end of the second inspection switching path is connected to the test terminals corresponding to the second group of battery cells under test, and the output end is connected to the inspection device. Therefore, when inspection is to be performed on the second group of battery cells under test, switching is performed to connect the test terminals corresponding to the second group of battery cells under test to the inspection device. Thus, automated pathway switching for inspection of different groups of batteries is implemented.

In some embodiments, the pathway switching circuit further includes an eighth switch array and a ninth switch array.

The eighth switch array is disposed in the first inspection switching path, an input end of the eighth switch array is connected to the test terminals corresponding to the first group of battery cells under test, and an output end of the eighth switch array is connected to the inspection device.

The ninth switch array is disposed in the second inspection switching path, an input end of the ninth switch array is connected to the test terminals corresponding to the second group of battery cells under test, and an output end of the ninth switch array is connected to the inspection device.

The eighth switch array is closed during testing of the first group of battery cells under test, connecting the test terminals corresponding to the first group of battery cells under test to the inspection device.

The ninth switch array is closed during testing of the second group of battery cells under test, connecting the test terminals corresponding to the second group of battery cells under test to the inspection device.

In the technical solution of the embodiments of this application, the eighth switch array and the ninth switch array are disposed in the pathway switching circuit. The eighth switch array is disposed in the first inspection switching path. The ninth switch array is disposed in the second inspection switching path. Therefore, during testing of different groups of battery cells under test, switching between different inspection paths can be performed for connection, implementing automation and flexible switching between testing of different groups of battery cells under test.

In some embodiments, the inspection device includes a first group of inspection devices and a second group of inspection devices.

An input end of the inspection switching path is connected to the test terminals corresponding to the first group of battery cells under test and the test terminals corresponding to the second group of battery cells under test, and the output end of the inspection switching path is connected to the first group of inspection devices and the second group of inspection devices.

The inspection switching path is configured to connect the test terminals corresponding to the first group of battery cells under test to the first group of inspection devices when the first group of battery cells under test are being inspected.

The inspection switching path is also configured to connect the test terminals corresponding to the second group of battery cells under test to the second group of inspection devices when the second group of battery cells under test are being inspected.

In the technical solution of the embodiments of this application, the first group of inspection devices and the second group of inspection devices are provided as the inspection device. The input end of the inspection switching path is connected to the test terminals corresponding to the first group of battery cells under test and the test terminals corresponding to the second group of battery cells under test. The output end of the inspection switching path is connected to the first group of inspection devices and the second group of inspection devices. Therefore, during inspection of different groups of battery cells under test, switching between different inspection circuits can be performed through the inspection switching pathway so as to inspect a plurality of groups of battery cells under test, improving the inspection efficiency.

In some embodiments, the inspection signal includes a first inspection signal.

The inspection switching path is also configured to connect, according to the first inspection signal, the test terminals corresponding to the first group of battery cells under test to the first group of inspection devices.

The first group of inspection devices is configured to obtain an inspection result of the first group of battery cells under test with the test terminals corresponding to the first group of battery cells under test connected to the first group of inspection devices.

In the technical solution of the embodiments of this application, according to the first inspection signal, the inspection switching path connects the test terminals corresponding to the first group of battery cells under test to the first group of inspection devices, so that inspection on the first group of battery cells under test can be performed through the first group of inspection devices and the inspection result can be obtained, thereby implementing rapid inspection of the first group of battery cells under test.

In some embodiments, the inspection signal further includes a second inspection signal.

The inspection switching path is also configured to connect, according to the second inspection signal, the test terminals corresponding to the second group of battery cells under test to the second group of inspection devices.

The second group of inspection devices is configured to obtain an inspection result of the second group of battery cells under test with the test terminals corresponding to the second group of battery cells under test connected to the second group of inspection devices.

In the technical solution of the embodiments of this application, according to the second inspection signal, the inspection switching path can connect the test terminals corresponding to the second group of battery cells under test to the second group of inspection devices, so that inspection on the second group of battery cells under test can be performed through the second group of inspection devices and the inspection result can be obtained, thereby implementing rapid inspection of the second group of battery cells under test.

In some embodiments, the inspection circuit further includes a filter circuit.

A first end of the filter circuit is connected to the inspection device, and a second end of the filter circuit is connected to the pathway switching circuit.

The filter circuit is configured to perform filtering during inspection of the battery cell under test.

In the technical solution of the embodiments of this application, a filter circuit is further disposed in the inspection circuit, so as to perform filtering during inspection of the battery cell under test, reducing the interference signal during the inspection.

In some embodiments, the inspection circuit further includes a protection circuit.

A first end of the protection circuit is connected to the inspection device, and a second end of the protection circuit is connected to the pathway switching circuit.

The protection circuit is configured to provide current limiting protection during inspection of the battery cell under test.

In the technical solution of the embodiments of this application, the protection circuit is further disposed in the inspection circuit so as to provide current limiting protection on each component during inspection of the battery cell under test, ensuring the safety of the circuit.

According to a second aspect, an embodiment of this application further proposes an inspection method, where the inspection method includes:

- obtaining an inspection signal;
- controlling, according to the inspection signal, a corresponding inspection device to connect to a test terminal corresponding to a battery cell under test; and
- inspecting, according to the inspection signal, the battery cell under test to obtain an inspection result.

In the technical solution of the embodiments of this application, the connection between the corresponding inspection device and the test terminal corresponding to the battery cell under test is controlled according to the corresponding inspection signal after the inspection signal is obtained. Therefore, the corresponding inspection device can connect to the test terminal corresponding to the battery cell under test to inspect the battery cell under test to obtain the inspection result. According to the inspection signal, the corresponding inspection device can be automatically switched to, so that inspection is performed on the battery cell under test, implementing automated inspection of the battery cell under test.

In some embodiments, the controlling, according to the inspection signal, a corresponding inspection device to connect to a test terminal corresponding to a battery cell under test includes:

determining, according to the inspection signal, a connection relationship between the test terminal corresponding to the battery cell under test and the inspection device;

determining, based on the connection relationship, a target switch array and a closing timing of the target switch array; and controlling, based on the closing timing for the target switch array, the target switch array to close to connect the corresponding inspection device to the test terminal corresponding to the battery cell under test.

In the technical solution of the embodiments of this application, the test terminal and the inspection device that need to be connected to the battery cell under test can be determined according to the specific inspection signal, so that the connection relationship thereof is determined. Then, the corresponding switch array and the closing timing of the switch array are determined based on the connection relationship, and the target switch array is controlled to be closed through the closing timing of the switch array. Thus, the corresponding inspection device can be controlled to be quickly connected to the test terminal corresponding to the battery cell under test, further increasing the inspection efficiency.

In some embodiments, the inspection signal includes an insulation inspection signal.

The controlling, according to the inspection signal, a corresponding inspection device to connect to a test terminal corresponding to a battery cell under test includes:

controlling, according to the insulation inspection signal, an insulation inspection device to connect to test terminals corresponding to positive electrodes of the battery cells under test.

In the technical solution of the embodiments of this application, the inspection signal includes the insulation inspection signal. When the obtained inspection signal is the insulation inspection signal, it can be determined that the inspection device is the insulation inspection device. Then, the insulation inspection device is controlled to connect to the test terminals corresponding to the positive electrodes of the battery cells under test. Thus, the insulation inspection device is quickly connected to the test terminal corresponding to the positive electrode of the battery cell under test according to the insulation inspection signal.

In some embodiments, the inspecting, according to the inspection signal, the battery cell under test to obtain an inspection result includes:

performing, according to the insulation inspection signal, insulation inspection on the test terminals corresponding to the positive electrodes of the battery cells under test to obtain an insulation inspection result.

In the technical solution of the embodiments of this application, the insulation inspection can be performed on the test terminals corresponding to the positive electrodes of the battery cells under test according to the insulation inspection signal, implementing automated insulation inspection between the positive electrodes of the battery cells under test.

In some embodiments, the inspection signal includes a voltage inspection signal and a continuity inspection signal.

the controlling, according to the inspection signal, a corresponding inspection device to connect to a test terminal corresponding to a battery cell under test includes:

controlling, according to the voltage inspection signal and the continuity inspection signal, a voltage inspection device to connect to a first test terminal corresponding to a positive electrode of the battery cell under test and a first test terminal corresponding to a negative electrode of the battery cell under test, and controlling, according to the continuity inspection signal, a continuity inspection device to connect to a second test terminal corresponding to the positive electrode of the battery cell under test and a second test terminal corresponding to the negative electrode of the battery cell under test.

In the technical solution of the embodiments of this application, the inspection signal includes the voltage inspection signal and the continuity inspection signal. When the obtained inspection signal is the voltage inspection signal and the continuity inspection signal, it can be determined that the inspection device is the voltage inspection device and the continuity inspection device. Then, the voltage inspection device and the continuity inspection device are controlled to be separately connected to the positive and negative electrodes corresponding to the battery cell under test. Thus, according to the voltage inspection signal and the continuity inspection signal, the voltage inspection device is quickly connected to the test terminals corresponding to the positive and negative electrodes of the battery cell under test, and the continuity inspection device is quickly connected to the test terminals corresponding to another group of positive and negative electrodes of the battery cell under test.

In some embodiments, the inspecting, according to the inspection signal, the battery cell under test to obtain an inspection result includes:

performing, according to the voltage inspection signal and the continuity inspection signal, voltage inspection and continuity inspection on the battery cell under test to obtain a voltage and a continuity inspection result.

In the technical solution of the embodiments of this application, voltage inspection and continuity inspection can be performed synchronously on the test terminals corresponding to different positive and negative electrodes of the battery cells under test according to the voltage inspection signal and the continuity inspection signal, implementing synchronized voltage and continuity inspections of the battery cell under test and shortening the test time.

BRIEF DESCRIPTION OF DRAWINGS

To describe technical solutions in some embodiments of this application more clearly, the following briefly describes the accompanying drawings required for describing some embodiments. Apparently, the accompanying drawings in the following descriptions show some embodiments of this application, and persons of ordinary skill in the art may still derive other drawings from structures shown in these accompanying drawings without creative efforts.

Figure 1:
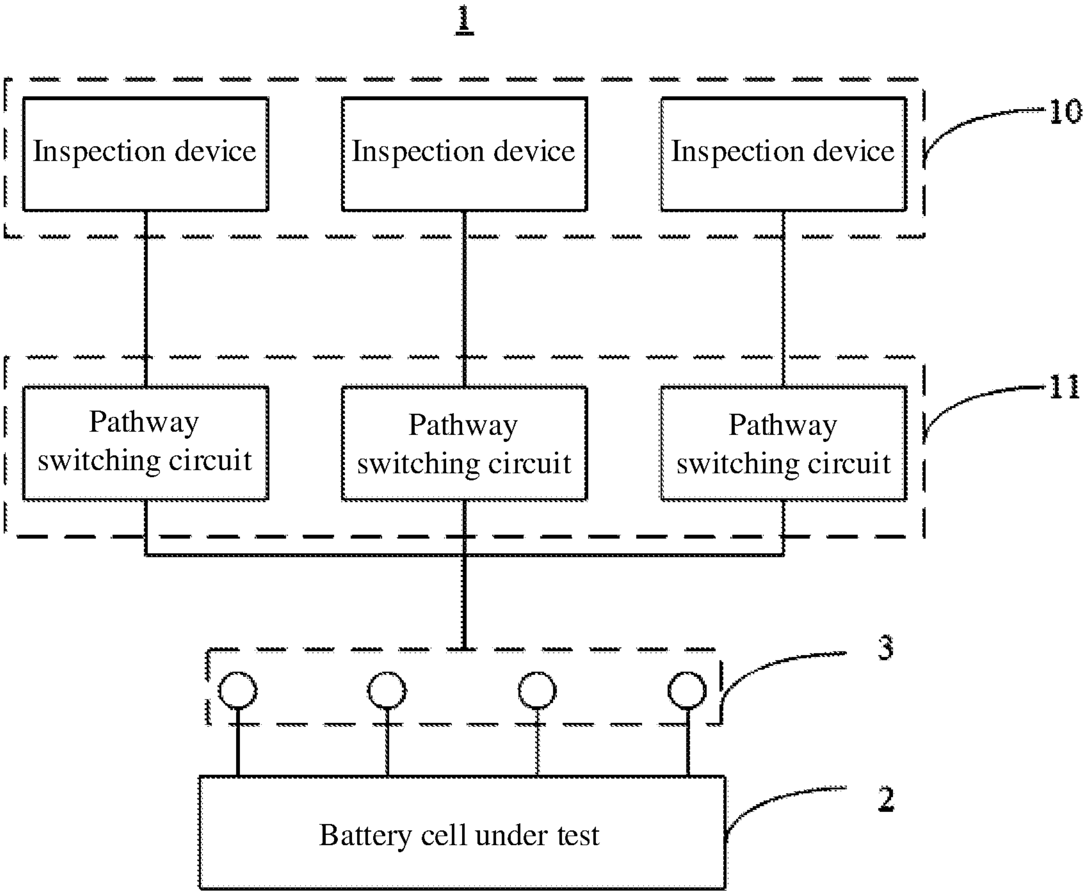
FIG. 1 is a schematic structural diagram of an inspection circuit according to an embodiment of this application.

Reference signs in the specific embodiments are described as follows:

- inspection circuit 1, battery cell 2 under test, and test terminal 3;
- inspection device 10, pathway switching circuit 11, filter circuit 12, and protection circuit 13;
- insulation inspection device 101, voltage inspection device 102, and continuity inspection device 103;
- insulation test path 111, voltage test path 112, multiplexing path 113, and continuity test path 114;
- first insulation test path 1111, second insulation test path 1112, first voltage test path 1121, second voltage test path 1122, first continuity test path 1141, and second continuity test path 1142;
- first to ninth switch array K1-K9, first switch K11, second switch K21, third switch K31, fourth switch K41, fifth switch K42, sixth switch K43, seventh switch K51, eighth switch K61, ninth switch K62, tenth switch K63, eleventh switch K71, twelfth switch K72, thirteenth switch K73, fourteenth switch K74, fifteenth switch K81, sixteenth switch K82, seventeenth switch K83, eighteenth switch K84, nineteenth switch K91, twentieth switch K92, twenty-first switch K93, twenty-second switch K94, twenty-third switch K12, and twenty-fourth switch K22;
- first group of battery cells under test: A1, and second group of battery cells under test: B1;
- first battery cell under test: 21, and second battery cell under test: 22;
- test terminal corresponding to positive electrode: 31*a*/31*b*, and test terminal corresponding to negative electrode: 32*c;*
- first test terminal 31*a*1 corresponding to the positive electrode, second test terminal 31*a*2 corresponding to the positive electrode, first test terminal 32*cl* corresponding to the negative electrode, and second test terminal 32*c*2 corresponding to the negative electrode.

The realization of the purpose, functional features, and advantages of this application will be further described in combination with the embodiments and with reference to the accompanying drawings.

DESCRIPTION OF EMBODIMENTS

The following describes in detail the embodiments of technical solutions of this application with reference to the accompanying drawings. The following embodiments are merely intended for a clearer description of the technical solutions of this application and therefore are used as just examples which do not constitute any limitations on the protection scope of this application.

Unless otherwise defined, all technical and scientific terms used herein shall have the same meanings as commonly understood by those skilled in the art to which this application relates. The terms used herein are intended to merely describe the specific embodiments rather than to limit this application. The terms "include", "comprise", and "have" and any other variations thereof in the specification, claims and brief description of drawings of this application are intended to cover non-exclusive inclusions.

In the description of the embodiments of this application, the terms "first", "second" and the like are merely intended to distinguish between different objects, and shall not be understood as any indication or implication of relative importance or any implicit indication of the number, sequence or primary-secondary relationship of the technical features indicated. In the description of this application, "a plurality of" means at least two unless otherwise specifically stated.

In this specification, reference to "embodiment" means that specific features, structures or characteristics described with reference to the embodiment may be incorporated in at least one embodiment of this application. The word "embodiment" appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

In the description of the embodiments of this application, the term "and/or" is only an associative relationship for describing associated objects, indicating that three relationships may be present. For example, A and/or B may indicate the following three cases: presence of only A, presence of both A and B, and presence of only B. In addition, the character "/" in this specification generally indicates an "or" relationship between contextually associated objects.

In the description of the embodiments of this application, the term "a plurality of" means more than two (inclusive). Similarly, "a plurality of groups" means more than two (inclusive) groups, and "a plurality of pieces" means more than two (inclusive) pieces.

In the description of the embodiments of this application, the orientations or positional relationships indicated by the technical terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", "axial", "radial", "circumferential", and the like are based on the orientations or positional relationships as shown in the accompanying drawings. These terms are merely for ease and brevity of description of the embodiments of this application rather than indicating or implying that the means or components mentioned must have specific orientations or must be constructed or manipulated according to specific orientations, and therefore shall not be construed as any limitations on embodiments of this application.

In the description of the embodiments of this application, unless otherwise specified and defined explicitly, the terms "mount", "connect", "join", and "fasten" should be understood in their general senses. For example, they may refer to a fixed connection, a detachable connection, or an integral connection, may refer to a mechanical connection or electrical connection, and may refer to a direct connection, an indirect connection via an intermediate medium, or an interaction between two elements. Persons of ordinary skill in the art can understand specific meanings of these terms in this application as appropriate to specific situations.

At present, during actual production process of batteries, for different battery product types, there may be positive poles and negative poles. There is a need to inspect the batteries.

In the existing solutions, battery is inspected manually. The positive and negative probes of the voltage resistance meter are manually switched to connect to the positive poles of the corresponding test terminals of the batteries under test, so that the insulation between the positive electrodes of the batteries is tested. The multimeter probes are also brought into contact with the positive and negative poles of the test terminals corresponding to the battery, so that the voltage of the battery is tested. This manual method of inspecting battery insulation and voltage has the risk of missing tests, and cannot be automated.

To address the above drawbacks, the present disclosure proposes the following concept:

An inspection circuit is designed. A battery cell consists of a positive pole and a negative pole. Each pole corresponds to two test terminals, and thus each battery cell corresponds to four test terminals, so that the corresponding test terminal is connected through a different test line. A pathway switching circuit is disposed in a test line. The output end of the pathway switching circuit is connected to a plurality of inspection devices, so as to automate the inspection of the battery cell through the inspection circuit. The pathway switching circuit can switch different inspection devices to connect to the corresponding test terminals of the battery cells, thereby implementing different types of inspection of the battery cells.

The inspection circuit disclosed in the embodiments of this application may be configured for inspection of a battery cell, or for inspection of an electric device using a battery as a power source, and for inspection of various energy storage systems using a battery as an energy storage element. The electric apparatus may be but is not limited to a mobile phone, a tablet, a laptop computer, an electric toy, an electric tool, an electric bicycle, an electric car, a ship, or a spacecraft. The electric toy may be a fixed or mobile electric toy, for example, a game console, an electric toy car, an electric toy ship, and an electric toy airplane. The spacecraft may include an airplane, a rocket, a space shuttle, a spaceship, and the like.

Based on the above considerations, to improve the automated inspection of a battery cell, an inspection circuit and method are proposed after in-depth research, which are applicable in various scenarios in which inspection is performed during the actual use of a battery.

To better understand the embodiments of this application, the inspection circuit and method provided according to the embodiments of this application will be described in detail below with reference to the accompanying drawings.

Referring to FIG. 1, FIG. 1 is a schematic structural diagram of an inspection circuit according to some embodiments of this application.

In some embodiments of this application, the inspection circuit 1 includes a plurality of inspection devices 10 and a plurality of pathway switching circuits 11. Input ends of the pathway switching circuits 11 are respectively connected to different test lines. The test lines are connected to a test terminal 3 corresponding to a battery cell 2 under test. Output ends of the pathway switching circuits 11 are respectively connected to the plurality of inspection devices 10.

It should be noted that the inspection circuit is provided with a plurality of inspection devices 10, and the types of the inspection devices 10 may be the same or different, for example, the inspection devices 10 may include a voltage inspection device, a current inspection device, an insulation inspection device, a power inspection device, a continuity inspection device, and the like, and may further be devices of other inspection types, which is not limited in the embodiments. The inspection device 10 may also be a plurality of identical inspection devices, for example, the inspection device 10 may all be a voltage inspection device or all be an insulation inspection device, and the like, which is not limited in the embodiments. The quantity of the inspection devices 10 may be configured according to specific inspection needs, and may also be configured according to the quantity of battery cells under test.

The pathway switching circuit 11 may correspond to the inspection device 10 one by one. Input ends of the pathway switching circuits 11 are respectively connected to different test lines. The test lines are connected to the test terminal 3 corresponding to the battery cell 2 under test. Output ends of the pathway switching circuits 11 are respectively connected to a plurality of inspection devices 10. The pathway switching circuit 11 can switch the state of connectivity between the inspection device 10 and the test terminal corresponding to the battery cell 2 under test.

A plurality of battery cells 2 under test may be present. Input ends of the pathway switching circuits 11 may be connected to a same battery cell 2 under test through the test line, and the input ends of the pathway switching circuits 11 may also be connected different battery cells 2 under test through the test lines.

The battery cell 2 under test may be placed on a probe board on which a plurality of probes are provided, and the probes are in contact with the battery cell 2 under test, so that an inspection circuit may be formed.

The test line may be arranged according to the function of the inspection device 10, for example, if the inspection device 10 includes an insulation inspection device and a voltage inspection device, the test line includes an insulation test line and a voltage test line. One end of the insulation test line is connected to the test terminals 3 corresponding to the battery cells 2 under test, the other end of the insulation test line is connected to the insulation inspection device. One end of the voltage test line is connected to the test terminals 3 corresponding to the battery cells 2 under test, the other end of the voltage test line is connected to the voltage inspection device.

It should be understood that the pathway switching circuit 11 is configured to connect, according to the inspection signal, the inspection device 10 corresponding to the inspection signal and the test terminals 3 corresponding to the battery cells 2 under test. The inspection device 10 is configured to obtain an inspection result of the battery cells 2 under test.

The inspection signal may be determined according to the inspection requirements. The inspection signal may include a voltage inspection signal, an insulation inspection signal, a continuity inspection signal, or an inspection signal for circuit switching, and the like. For example, if the inspection signal is a voltage inspection signal, the pathway switching circuit 11 may connect the voltage inspection device and the test terminals 3 corresponding to the battery cells 2 under test according to the voltage inspection signal.

As an example, the inspection device 10, when connected to the test terminals 3 corresponding to the battery cells 2 under test, may inspect the battery cells 2 under test to obtain an inspection result of the battery cells 2 under test.

In this embodiment, a plurality of inspection devices 10 and a plurality of pathway switching circuits 11 are disposed in an inspection circuit 1. Input ends of the pathway switching circuits 11 are respectively connected to different test lines. The test lines are connected to a test terminal 3 corresponding to a battery cell 2 under test. Output ends of the pathway switching circuits 11 are respectively connected to the plurality of inspection devices 10. The pathway switching circuit 11 is configured to connect, according to the inspection signal, the inspection device 10 corresponding to the inspection signal and the test terminals 3 corresponding to the battery cells 2 under test. The inspection device 10 is configured to obtain an inspection result of the battery cells 2 under test. According to the inspection signal, the corresponding inspection device 10 can be automatically switched to, so that inspection is performed on the battery cells 2 under test. Thus, inspection of the battery cells 2 under test is automated.

In some embodiments of this application, the inspection device 10 may be provided in a variety of types, so that different types of inspection may be performed on the battery cells 2 under test through different types of inspection devices 10.

Figure 2:
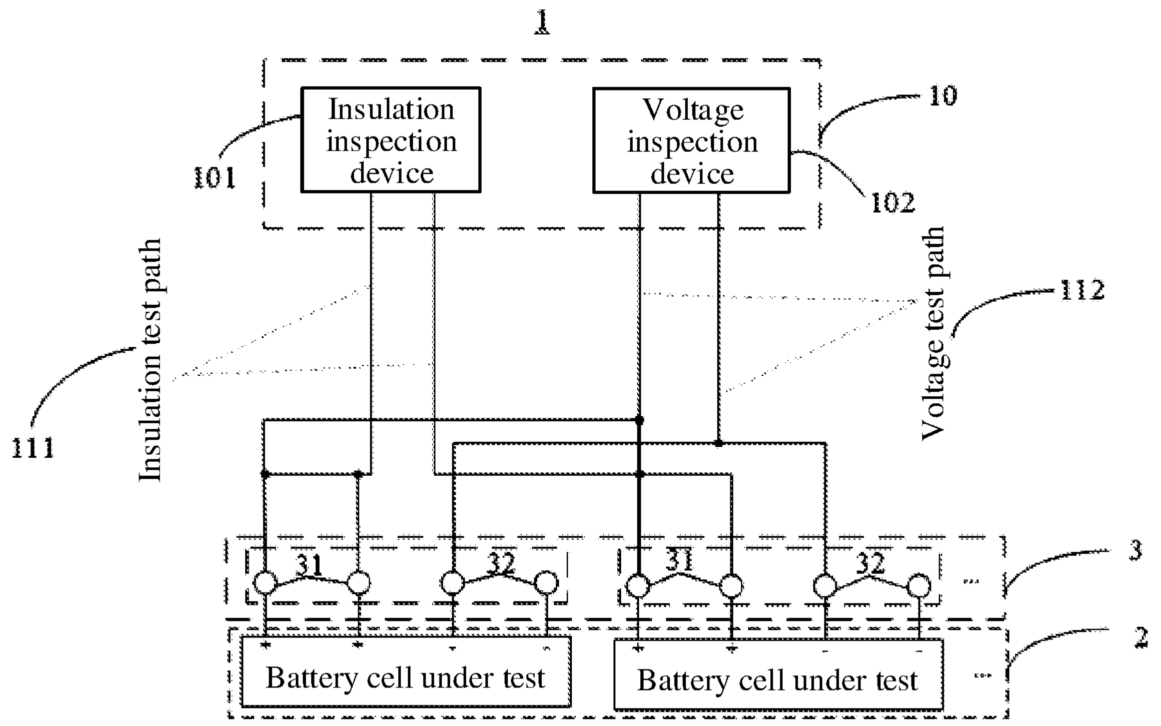
FIG. 2 is another schematic structural diagram of an inspection circuit according to an embodiment of this application.

Refer to FIG. 2. The inspection device 10 includes an insulation inspection device 101 and a voltage inspection device 102. A plurality of battery cells 2 under test are present. The pathway switching circuit 11 includes an insulation test path 111 and a voltage test path 112. The input end of the insulation test path 111 is connected to the test terminals 31 corresponding to the positive electrodes of the plurality of battery cells 2 under test. The output end of the insulation test path 111 is connected to the insulation inspection device 101. Input ends of the voltage test paths 112 are respectively connected to the test terminals 31 corresponding to the positive electrodes of the battery cells 2 under test and the test terminals 32 corresponding to the negative electrodes of the battery cells 2 under test. The output end of the voltage test path 112 is connected to the voltage inspection device 102.

It should be noted that the quantity of the insulation inspection devices 101 and the voltage inspection devices 102 may be 1 or more, which is not limited in this embodiment. The insulation inspection device 101 and the voltage inspection device 102 being both provided as 1 is used as an example in the illustration in this embodiment.

The battery cell 2 under test is provided in plurality. The pathway switching circuit 11 includes an insulation test path 111 and a voltage test path 112. The input end of the insulation test path 111 is connected to the test terminals 31 corresponding to the positive electrodes of the plurality of battery cells 2 under test. The output end of the insulation test path 111 is connected to the insulation inspection device 101. The insulation inspection device 101 can test the insulation between the positive electrodes of the plurality of battery cells 2 under test through the insulation test path 111.

Input ends of the voltage test paths 112 are respectively connected to the test terminals 31 corresponding to the positive electrodes of the battery cells 2 under test and the test terminals 32 corresponding to the negative electrodes of the battery cells 2 under test. The output end of the voltage test path 112 is connected to the voltage inspection device 102. The voltage inspection device 102 can be used for conducting a voltage test of the interior of the battery cells 2 under test through the voltage test path 112.

As an example, the insulation inspection device 101 is configured to obtain an insulation inspection result of the battery cells 2 under test with the insulation test path 111 connected; and the voltage inspection device 102 is configured to obtain a voltage inspection result of the battery cells 2 under test with the voltage test path 112 connected.

The insulation inspection device 101 may be a device for performing insulation inspection of the battery cells 2 under test, such as an insulation tester, and may also be other devices that can be used for performing insulation inspection. The insulation tester may be a dielectric strength tester, a voltage resistance meter, or the like. The voltage inspection device 102 may be a device for voltage inspection of the battery cells 2 under test, such as a voltage tester, and may also be other devices for performing voltage inspection. The voltage tester may be a multimeter.

The connectivity state of the insulation test path 111 and the voltage test path 112 can be switched. For example, if voltage inspection needs to be performed on the battery cells 2 under test, the voltage test path 112 connects the test terminals corresponding to the positive electrodes and the negative electrodes of the battery cells 2 under test to the voltage inspection device 102. At this time, the insulation test path 111 is in a disconnected state. For example, if insulation inspection needs to be performed on the battery cells under test, the insulation test path 111 connects the test terminals corresponding to the positive electrodes of the battery cells 2 under test to the insulation inspection device 101. At this time, the voltage test path 112 is in a disconnected state. The connectivity state of the insulation test path 111 and the voltage test path 112 may be controlled by a switch or directly by a line.

In the technical solution of the embodiments of this application, the insulation inspection device 101 and the voltage inspection device 102 are provided as the inspection device 10. A different inspection device 10 is connected to a corresponding test path. The corresponding inspection device 10 can inspect the battery cells 2 under test to obtain an inspection result with the corresponding test path connected. The voltage and insulation of the battery cells 2 under test can be inspected separately, adapting to the different inspection types for the battery cells 2 under test, and expanding the scope of the inspection of the battery cells 2 under test.

It should be understood that when the insulation inspection is performed on the battery cells 2 under test, the insulation between the test terminals corresponding to the positive electrodes of at least two battery cells 2 under test is tested. Therefore, the quantity of the insulation test paths 111 may be configured according to the quantity of battery cells 2 under test. For example, if the battery cells 2 under test is in a quantity of 2, and the battery cells 2 under test are independent of the other, then the insulation test path 111 may be configured as two, which separately connect the test terminals corresponding to the positive electrodes of the battery cells 2 under test. This facilitates separate control of the connectivity state between the battery cells 2 under test and the insulation inspection device 101.

Optionally, the insulation test path 111 includes a first insulation test path 1111 and a second insulation test path 1112. The plurality of battery cells 2 under test include a first battery cell 21 under test and a second battery cell 22 under test. The first battery cell 21 under test and the second battery cell 22 under test are independent of each other. The input end of the first insulation test path 1111 is connected to the test terminal 31 corresponding to the positive electrode of the first battery cell 21 under test, and the output end of the first insulation test path 1111 is connected to the insulation inspection device 101. The input end of the second insulation test path 1112 is connected to the test terminal 31 corresponding to the positive electrode of the second battery cell 22 under test, and the output end of the second insulation test path 1112 is connected to the insulation inspection device 101.

As an example, the battery cells 2 under test include a first battery cell 21 under test and a second battery cell 22 under test. During insulation inspection of the first battery cell 21 under test and the second battery cell 22 under test, the test terminal 31 corresponding to the positive electrode of the first battery cell 21 under test and the test terminal 31 corresponding to the positive electrode of the second battery cell 22 under test are connected to the corresponding input ends of the insulation test path 111, respectively. In this case, the insulation test path 111 is divided into a first insulation test path 1111 and a second insulation test path 1112.

The first battery cell 21 under test and the second battery cell 22 under test are independent of each other and are not connected to each other. The test terminal 31 corresponding to the positive electrode of the first battery cell 21 under test and the test terminal 31 corresponding to the positive electrode of the second battery cell 22 under test are both provided in two. The input end of the first insulation test path 1111 may be separately connected to a certain test terminal 31*a* corresponding to the positive electrode of the first battery cell 21 under test, and may also be connected to all test terminals 31 corresponding to the positive electrode of the first battery cell 21 under test. The input end of the second insulation test path 1112 may be separately connected to a certain test terminal 31*b* corresponding to the positive electrode of the second battery cell 22 under test, and may also be connected to all test terminals 31 corresponding to the positive electrode of the second battery cell 22 under test.

Figure 3A:
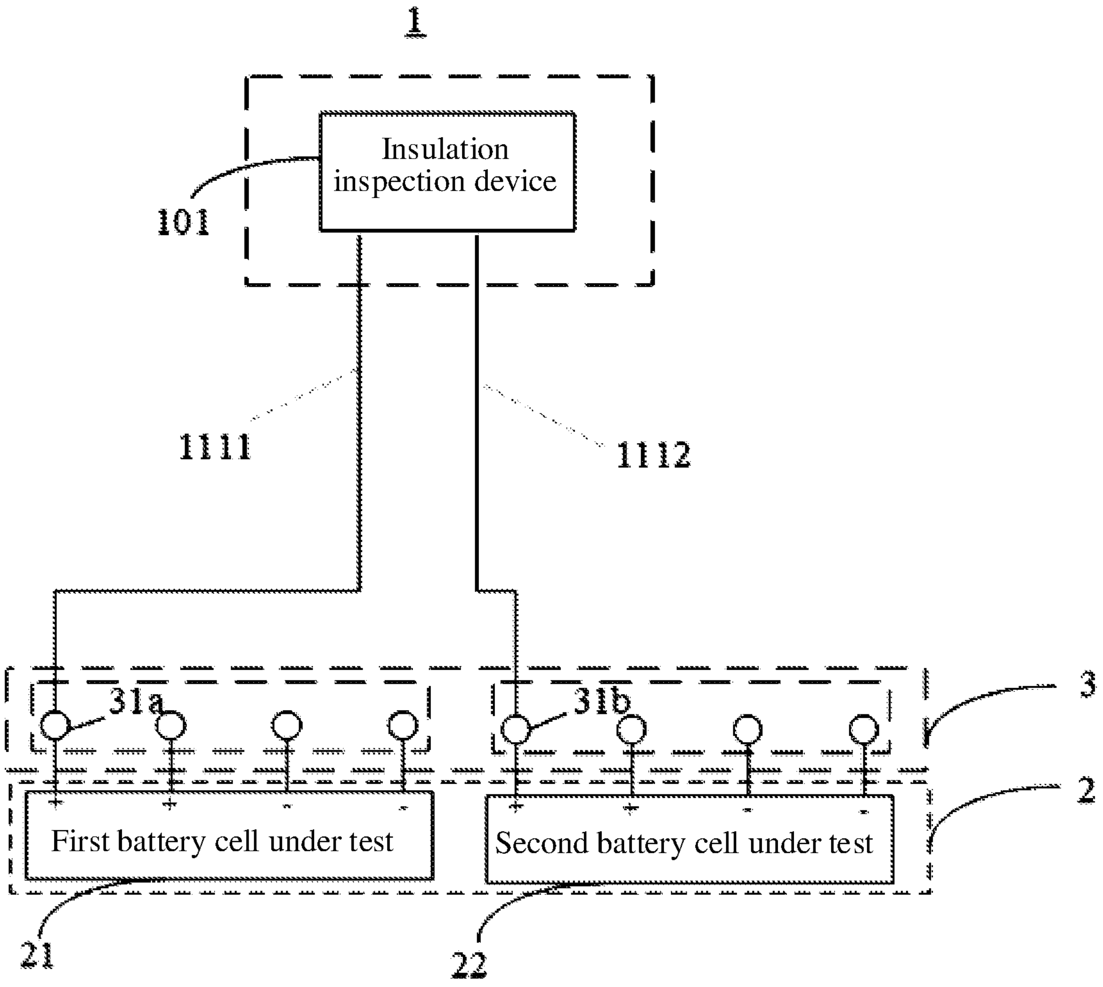
FIGS. 3*a* to 3*d* are a schematic structural diagram of an inspection circuit in which an insulation inspection device is connected to a battery cell under test according to an embodiment of this application.
Figure 3B:
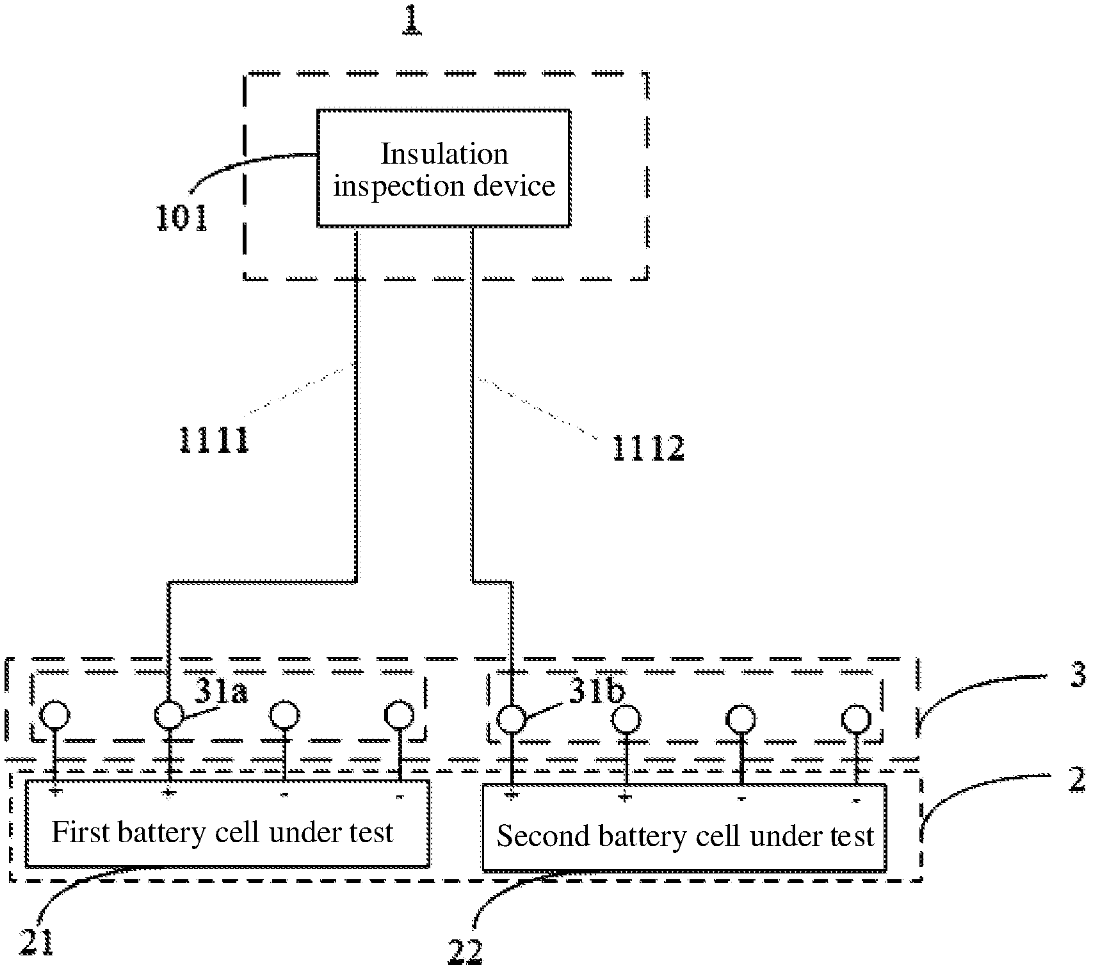
Figure 3C:
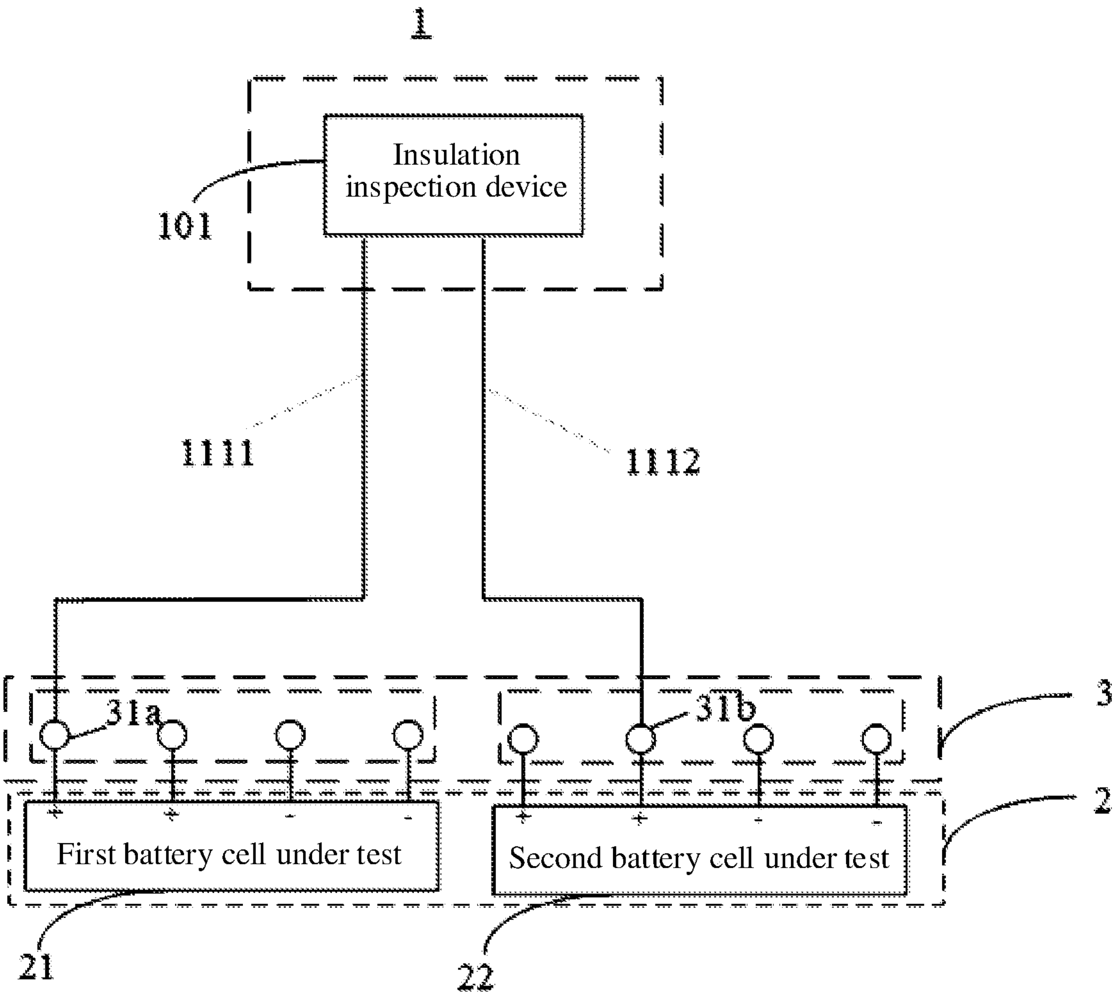
Figure 3D:
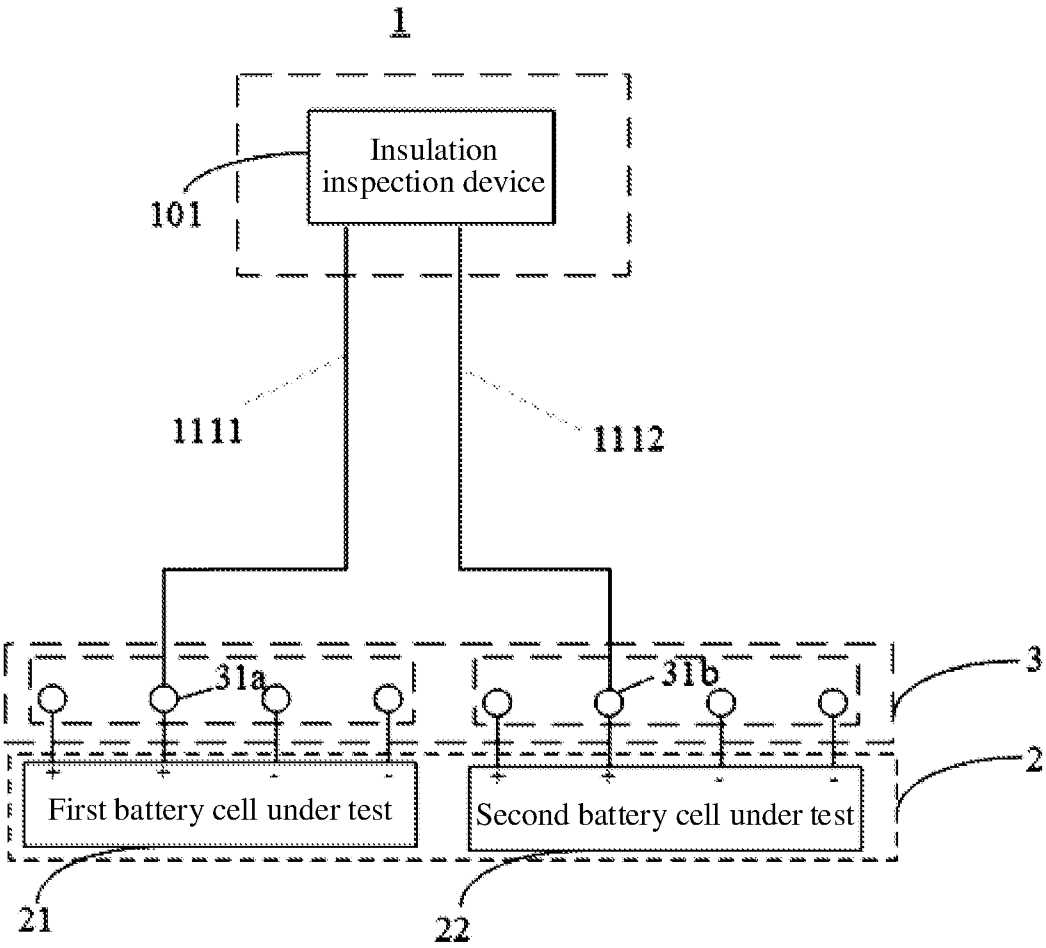

Refer to FIGS. 3*a* to 3*d*. In FIG. 3*a*, the first test terminal 31*a*1 corresponding to the positive electrode of the first battery cell 21 under test is connected to the input end of the first insulation test path 1111, and the first test terminal 31*b*1 corresponding to the positive electrode of the second battery cell 22 under test is connected to the input end of the second insulation test path 1112. In FIG. 3*b*, the second test terminal 31*a*2 corresponding to the positive electrode of the first battery cell 21 under test is connected to the input end of the first insulation test path 1111, and the first test terminal 31*b*1 corresponding to the positive electrode of the second battery cell 22 under test is connected to the input end of the second insulation test path 1112. In FIG. 3*c*, the first test terminal 31*a*1 corresponding to the positive electrode of the first battery cell 21 under test is connected to the input end of the first insulation test path 1111, and the second test terminal 31*b*2 corresponding to the positive electrode of the second battery cell 22 under test is connected to the input end of the second insulation test path 1112. In FIG. 3*d*, the second test terminal 31*a*2 corresponding to the positive electrode of the first battery cell 21 under test is connected to the input end of the first insulation test path 1111, and the second test terminal 31*b*2 corresponding to the positive electrode of the second battery cell 22 under test is connected to the input end of the second insulation test path 1112.

The input end of the first insulation test path 1111 may also be connected to all test terminals 31 corresponding to the positive electrode of the first battery cell 21 under test. To facilitate switching during the test, a switch may be provided on the first insulation test path 1111. The switch can be configured to switch the input end of the first insulation test path 1111 to connect to the first test terminal 31*a*1 or the second test terminal 31*a*2 corresponding to the positive electrode of the first battery cell 21 under test. The input end of the second insulation test path 1112 may also be connected to all test terminals 31 corresponding to the positive electrode of the second battery cell 22 under test. To facilitate switching during the test, a switch may be provided on the second insulation test path 1112. The switch can be configured to switch the input end of the second insulation test path 1112 to connect to the first test terminal 31*b*1 or the second test terminal 31*b*2 corresponding to the positive electrode of the second battery cell 22 under test. This allows the insulation inspection electrical circuit between the positive electrode of the first battery cell 21 under test and the positive electrode of the second battery cell 22 under test to be compatible with different situations of the positive electrodes.

In the technical solution of the embodiments of this application, when an inspection result is obtained by performing insulation inspection on the battery cells 2 under test by the insulation inspection device 101, the insulation test path 111 is divided into the first insulation test path 1111 and the second insulation test path 1112, so as to separately perform insulation inspection between the positive electrode of the first battery cell 21 under test and the positive electrode of the second battery cell 22 under test. Compared to manual testing of insulation between battery cells 2 under test, which has the problem of missed testing, this application can realize self-checking of the insulation inspection circuit during the inspection, thereby improving the accuracy and completeness of the inspection.

Optionally, to facilitate path switching of the insulation test path 111, a switch array may be separately provided on the first insulation test path 1111 and the second insulation test path 1112, so as to switch the connected paths via the switch array.

Figure 4:
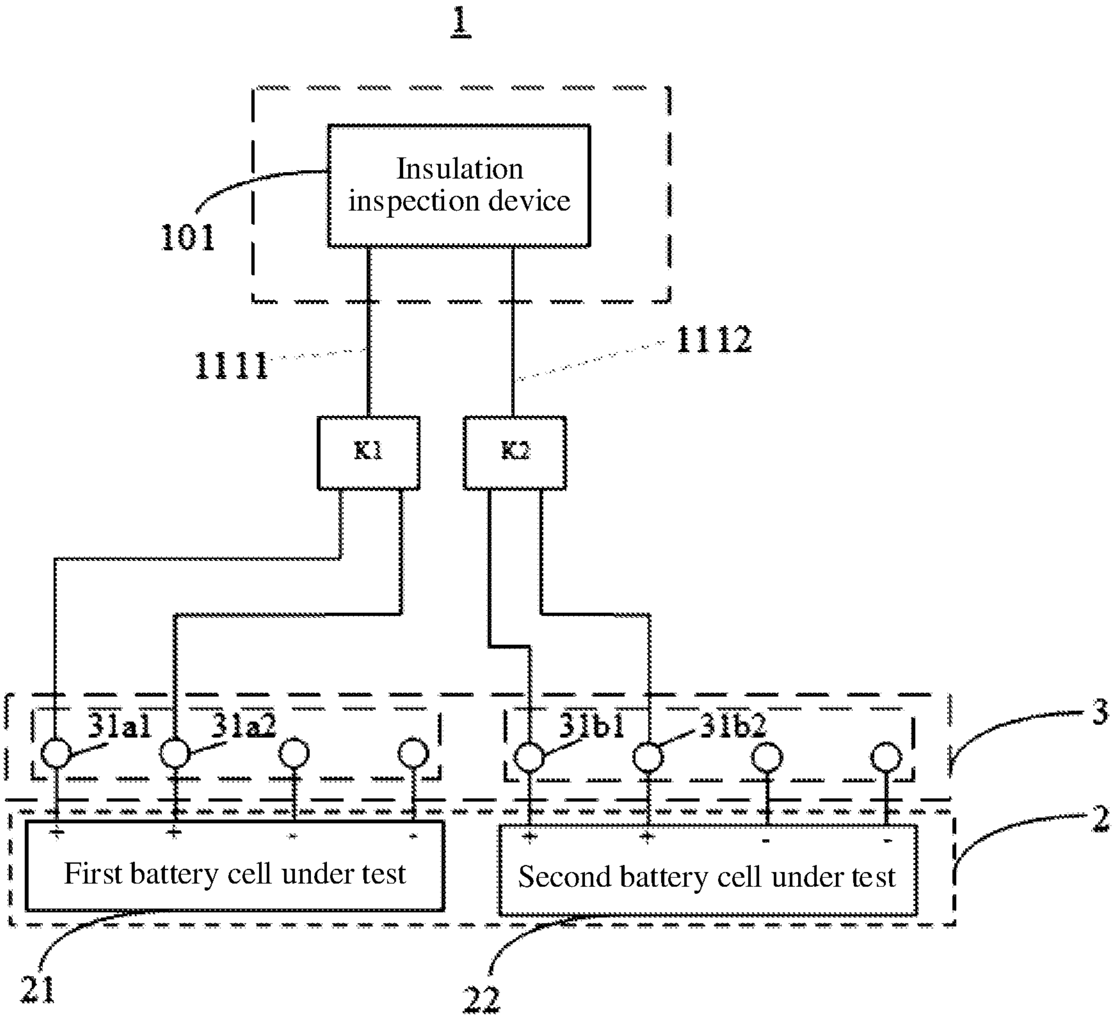
FIG. 4 is another schematic structural diagram of an inspection circuit in which an insulation inspection device is connected to a battery cell under test according to an embodiment of this application.

In some embodiments, as shown in FIG. 4, the pathway switching circuit 11 further includes a first switch array K1 and a second switch array K2.

The first switch array K1 is disposed in the first insulation test path 1111. An input end of the first switch array K1 is connected to a test terminal 311 corresponding to the positive electrode of the first battery cell 21 under test, and an output end of the first switch array K1 is connected to the insulation inspection device 101.

The second switch array K2 is disposed in the second insulation test path 1112. An input end of the second switch array K2 is connected to a test terminal 311 corresponding to the positive electrode of the second battery cell 22 under test, and an output end of the second switch array K2 is connected to the insulation inspection device 101.

It should be noted that the quantity of switches in the first switch array K1 may be two or more, and the quantity of switches in the second switch array K2 may be two or more. The first switch array K1 is disposed in the first insulation test path 1111. The input end of the first switch array K1 may be separately connected to the first test terminal 31*a*1 and the second test terminal 31*a*2 corresponding to the positive electrode of the first battery cell 21 under test. The output end of the first switch array K1 is connected to the insulation inspection device 101. The first switch array K1 can be configured to switch the first test terminal 31*a*1 corresponding to the positive electrode of the first battery cell 21 under test to connect to the insulation inspection device 101, and the first switch array K1 can also be configured to switch the second test terminal 31*a*2 corresponding to the positive electrode of the first battery cell 21 under test to connect to the insulation inspection device 101.

The second switch array K2 is disposed in the first insulation test path 1112. The input end of the second switch array K2 can be separately connected to the first test terminal 31*b*1 and the second test terminal 31*b*2 corresponding to the positive electrode of the second battery cell 22 under test. The output end of the second switch array K2 is connected to the insulation inspection device 101. The second switch array K2 can be configured to switch the first test terminal 31*b*1 corresponding to the positive electrode of the second battery cell 22 under test to connect to the insulation inspection device 101, and the second switch array K2 can also be configured to switch the second test terminal 31*b*2 corresponding to the positive electrode of the second battery cell 22 under test to connect to the insulation inspection device 101.

It should be understood that the first switch array K1 and the second switch array K2 are configured to be closed during insulation test of the first battery cell 21 under test and the second battery cell 22 under test, simultaneously connecting the test terminal 31 corresponding to the positive electrode of the first battery cell 21 under test to the insulation inspection device 101 and the test terminal 31 corresponding to the positive electrode of the second battery cell 22 under test to the insulation inspection device 101.

The first switch array K1 is closed during an insulation test of the first battery cell 21 under test, connecting the test terminal 31 corresponding to the positive electrode of the first battery cell 21 under test with the insulation inspection device 101. The first switch array K1 is also configured to switch a circuit loop between the first test terminal 31*a*1 and the second test terminal 31*a*2 corresponding to the positive electrode of the first battery cell 21 under test and the insulation inspection device 101.

The second switch array K2 is closed during an insulation test of the second battery cell 22 under test, connecting the test terminal 31 corresponding to the positive electrode of the second battery cell 22 under test with the insulation inspection device 101. The second switch array K2 is also configured to switch a circuit loop between the first test terminal 31*b*1 and the second test terminal 31*b*2 corresponding to the positive electrode of the second battery cell 22 under test and the insulation inspection device 101.

To simultaneously perform insulation test on the first battery cell 21 under test and the second battery cell 22 under test, the first switch array K1 and the second switch array K2 are both closed. Thus, insulation test can be performed on the positive electrodes of the first battery cell 21 under test and the second battery cell 22 under test.

In the technical solution of the embodiments of this application, the first switch array K1 and the second switch array K2 are disposed in the pathway switching circuit 11. The first switch array K1 is disposed in the first insulation test path 1111, and the second switch array K2 is disposed in the second insulation test path 1112, and they are closed during insulation test between the positive electrodes of the first battery cell 21 under test and the second battery cell 22 under test, implementing a design compatible with the insulation test circuit between positive electrodes of the battery cells 2 under test.

It should be understood that during voltage inspection of the battery cells 2 under test, the voltage between the test terminals 31 corresponding to the positive electrodes and the test terminals 32 corresponding to the negative electrodes of the battery cells 2 under test is tested. Therefore, a path for the test terminal 31 corresponding to the positive electrode and a path for the test terminal 32 corresponding to the negative electrode may be separately provided for the voltage test path 112. For example, when voltage inspection is to be performed on the first battery cell 21 under test in the battery cells 2 under test, the voltage test path 112 is separately provided at the test terminal 31 corresponding to the positive electrode and the test terminal 32 corresponding to the negative electrode of the first battery cell 21 under test.

Figure 5:
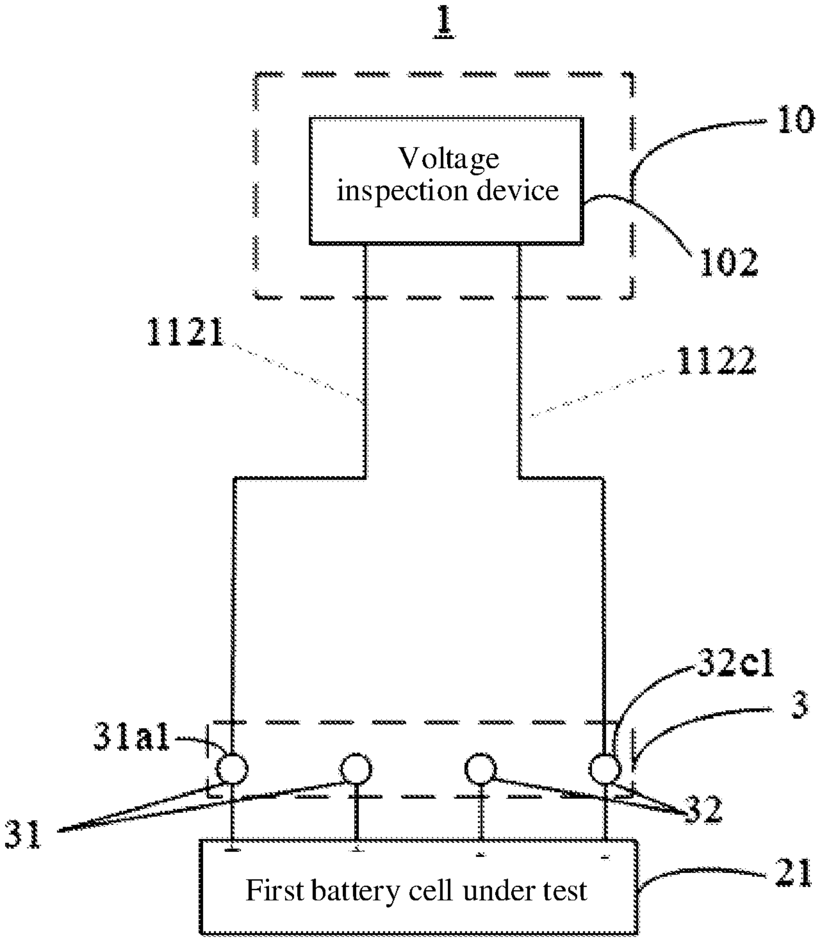
FIG. 5 is a schematic structural diagram of an inspection circuit in which a voltage inspection device is connected to a battery cell under test according to an embodiment of this application.

In some embodiments, as shown in FIG. 5, the voltage test path 112 includes a first voltage test path 1121 and a second voltage test path 1122.

An input end of the first voltage test path 1121 is connected to first test terminals 31*a*1 corresponding to the positive electrodes of the battery cells 2 under test, and an output end of the first voltage test path 1121 is connected to the voltage inspection device 102.

An input end of the second voltage test path 1122 is connected to first test terminals 32*cl* corresponding to the negative electrodes of the battery cells 2 under test, and an output end of the second voltage test path 1122 is connected to the voltage inspection device 102.

It should be noted that, since there are two test terminals corresponding to a positive electrode of a battery cell 2 under test and two test terminals corresponding to a negative electrode of the battery cell 2 under test, during voltage inspection, the voltage inspection device 102 is connected to the output ends of the first voltage test path 1121 and the second voltage test path 1122; the input end of the first voltage test path 1121 is connected to the test terminal 31 corresponding to the positive electrode of the battery cell 2 under test; and the input end of the second voltage test path 1122 is connected to the test terminal 32 corresponding to the negative electrode of the battery cell under test, thereby forming a voltage inspection circuit.

During voltage inspection of the first battery cell 21 under test, the input end of the first voltage test path 1121 may be connected to the first test terminal 31*a*1 corresponding to the positive electrode of the first battery cell 21 under test, and the input end of the second voltage test path 1122 may be connected to the first test terminal 32*cl* corresponding to the negative electrode of the first battery cell 21 under test.

In the technical solution of the embodiments of this application, the first voltage test path 1121 and the second voltage test path 1122 are disposed in the voltage test path 112. The first voltage test path 1121 is connected to the test terminals 3 corresponding to the positive electrodes of the battery cells 2 under test. The second voltage test path 1122 is connected to the test terminals 3 corresponding to the negative electrodes of the battery cells 2 under test. Thus, a voltage inspection circuit is formed between the first voltage test path 1121, the second voltage test path 1122, the positive and negative electrodes of the battery cells 2 under test, and the voltage inspection device 102, implementing automated voltage inspection of the battery cells 2 under test.

It should be noted that, to facilitate path switching of the voltage test path 112, a switch array may be separately provided on the first voltage test path 1121 and the second voltage test path 1122, so as to switch the voltage test path 112 via the switch array.

Figure 6:
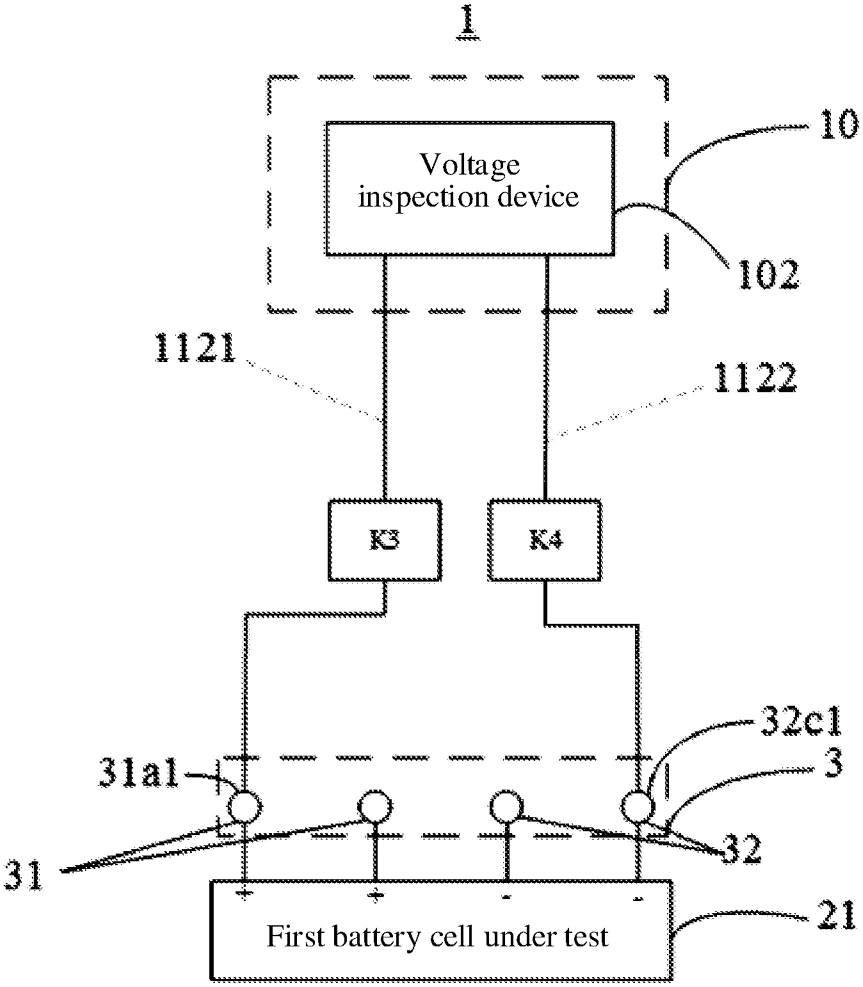
FIG. 6 is another schematic structural diagram of an inspection circuit in which a voltage inspection device is connected to a battery cell under test according to an embodiment of this application.

In some embodiments, as shown in FIG. 6, the pathway switching circuit 11 further includes a third switch array K3 and a fourth switch array K4.

The third switch array K3 is disposed in the first voltage test path 1121. An input end of the third switch array K3 is connected to the first test terminals 3 corresponding to the positive electrodes of the battery cells 2 under test, and an output end of the third switch array K3 is connected to the voltage inspection device 102.

The fourth switch array K4 is disposed in the second voltage test path 1122. An input end of the fourth switch array K4 is connected to the second test terminals 3 corresponding to the negative electrodes of the battery cells 2 under test, and an output end of the fourth switch array K4 is connected to the voltage inspection device 102.

It should be understood that the quantity of switches in the third switch array K3 and the fourth switch array K4 may be two or more. The third switch array K3 is disposed in the first voltage test path 1121 such that a circuit loop of the first voltage test path 1121 can be connected or disconnected through the third switch array K3. An input end of the third switch array K3 is connected to first test terminals 31*a*1 corresponding to the positive electrodes of the battery cells 2 under test, and an output end of the third switch array K3 is connected to the voltage inspection device 102.

The fourth switch array K4 is disposed in the second voltage test path 1122, so that a circuit loop of the second voltage test path 1122 can be connected or disconnected through the fourth switch array K4. An input end of the fourth switch array K4 is connected to first test terminals 32*cl* corresponding to the negative electrodes of the battery cells 2 under test, and an output end of the fourth switch array K4 is connected to the voltage inspection device 102.

In some embodiments, the third switch array K3 and the fourth switch array K4 are configured to be closed during voltage testing of the battery cells 2 under test, connecting the first test terminals 31*a*1 corresponding to the positive electrodes of the battery cells 2 under test to the voltage inspection device 102, and connecting the second test terminals 32*cl* corresponding to the negative electrodes of the battery cells 2 under test to the voltage inspection device 102.

Optionally, a plurality of switches may be provided in the third switch array K3, so as to control the continuity of the first voltage test path 1121 through the switches. The switches may be transistors such as triodes, MOS transistors, and other switching devices such as relays. A plurality of switches may further be provided in the fourth switch array K4. The quantity of switches of the third switch array K3 and the fourth switch array K4 may correspond to each other. The continuity of the second voltage test path 1122 can be controlled through the switches. For example, when the current battery cell 2 under test is the first battery cell 21 under test, during voltage inspection of the first battery cell 21 under test, the third switch array K3 and the fourth switch array K4 are both closed, connecting the first test terminal 31*a*1 corresponding to the positive electrode of the first battery cell 21 under test to the voltage inspection device 102, and connecting the first test terminal 32*cl* corresponding to the negative electrode of the first battery cell 21 under test to the voltage inspection device 102.

If insulation inspection is to be performed on the battery cells 2, the third switch array K3 and the fourth switch array K4 are used to disconnect the corresponding first voltage test path 1121 and the second voltage test path 1122.

If voltage inspection is to be performed on the battery cells 2 under test, the first switch array K1 and the second switch array K2 are used to disconnect the corresponding first insulation test path 1111 and the second insulation test path 1112.

In the technical solution of the embodiments of this application, the third switch array K3 and the fourth switch array K4 are further disposed in the pathway switching circuit 11. The third switch array K3 is disposed in the first voltage test path 1121, and the fourth switch array K4 is disposed in the second voltage test path 1122, and they are closed during voltage test between the positive and negative electrodes of the battery cells 2 under test, implementing automated test of the voltage between positive and negative electrodes of the battery cells 2 under test.

It should be noted that when the insulation inspection device 101 is used to inspect the battery cells 2 under test, the insulation test path 111 is connected to the test terminal 31*a* corresponding to the positive electrodes of the battery cells 2 under test; and when the voltage inspection device 102 is used to test the voltage of the battery cells 2 under test, the input end of the first voltage test path 1121 in the voltage test path 112 is also connected to first test terminals 31*a*1 corresponding to the positive electrodes of the battery cells 2 under test. There is an overlapping portion of the line, so that part of the line can be multiplexed to save resources.

Figure 7:
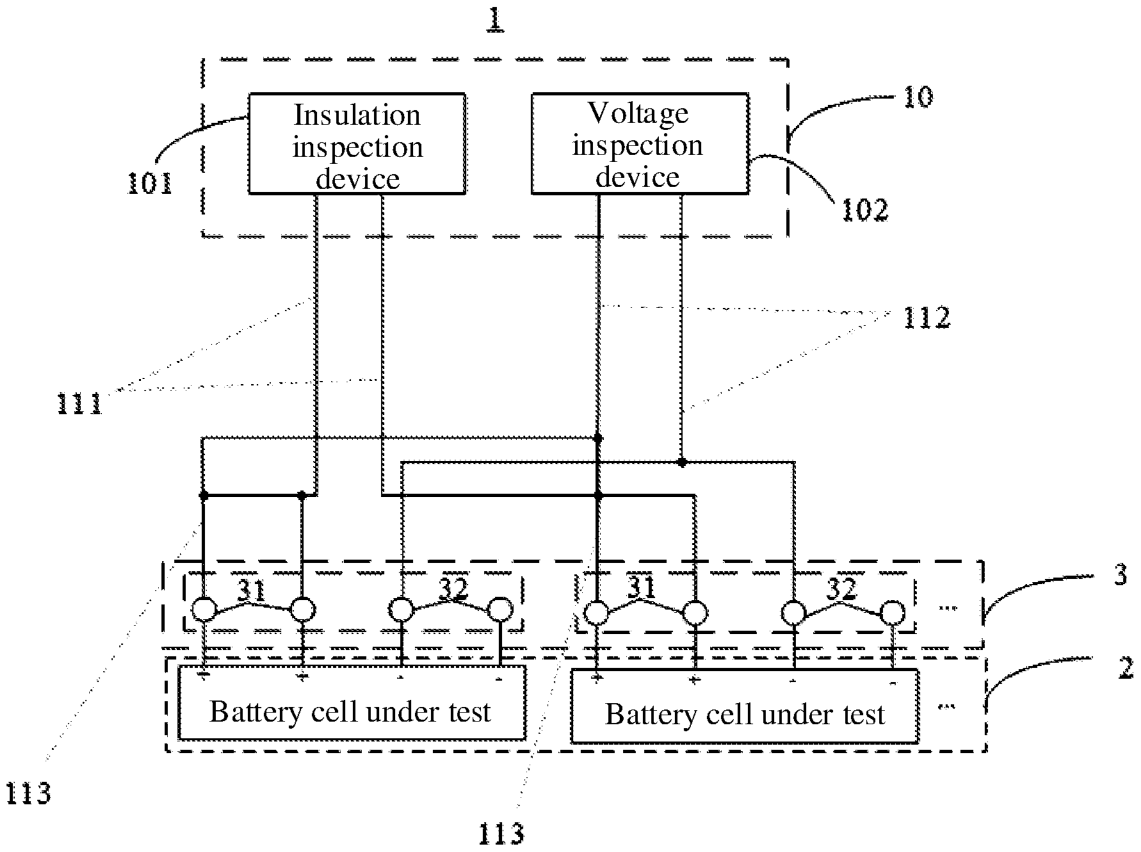
FIG. 7 is another schematic structural diagram of an inspection circuit in which a voltage inspection device is connected to a battery cell under test according to an embodiment of this application.

In an embodiment, as shown in FIG. 7, the pathway switching circuit 11 further includes a multiplexing path 113, where the input end of the insulation test path 111 and the input end of the voltage test path 112 are simultaneously connected to the test terminals 31*a* corresponding to the positive electrodes of the battery cells 2 under test both through the multiplexing path 113.

It should be noted that the output end of the multiplexing path 113 may be simultaneously connected to the input end of the insulation test path 111 and the input end of the voltage test path 112, and the input end of the multiplexing path 113 is connected to the first test terminals 31*a*1 corresponding to the positive electrodes of the battery cells 2 under test.

In the technical solution of the embodiments of this application, the multiplexing path 113 is further disposed in the pathway switching circuit 11, so that insulation inspection and voltage inspection of the battery cells 2 under test can be implemented simultaneously through connection by the multiplexing path 113, thus improving the inspection efficiency.

As an example, in addition to the voltage inspection of the battery cells 2 under test, continuity inspection may be directly performed on another other group of positive and negative electrodes of the battery cells 2 under test, thereby completing the overall inspection of the battery cells 2 under test. Therefore, the inspection device 10 may also be provided with a device for conducting continuity inspection of the battery cells 2 under test.

Figure 8:
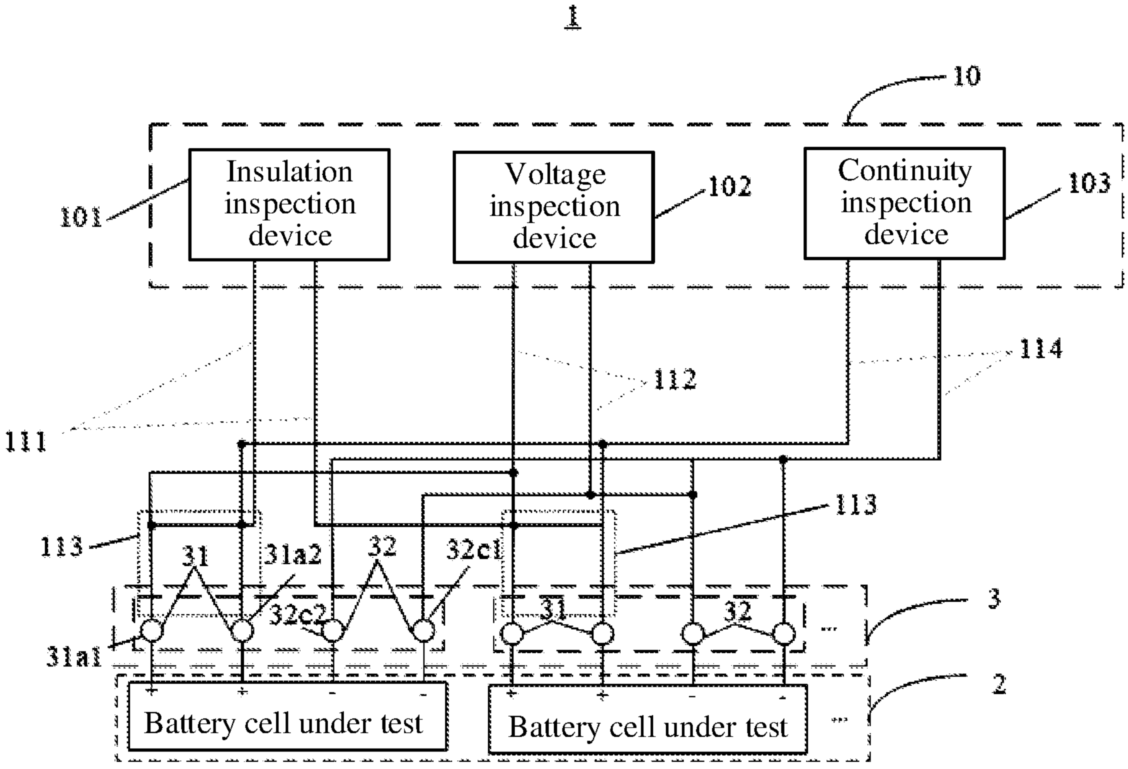
FIG. 8 is another schematic structural diagram of an inspection circuit according to an embodiment of this application.

In some embodiments, as shown in FIG. 8, the inspection device 10 further includes a continuity inspection device 103, and the pathway switching circuit 11 further includes a continuity test path 114.

An input end of the continuity test path 114 is connected to the second test terminals 31*a*2 corresponding to the positive electrodes of the battery cells 2 under test through the multiplexing path 113, the input end of the continuity test path 114 is further connected to the second test terminals 32*c*2 corresponding to the negative electrodes of the battery cells 2 under test, and an output end of the continuity test path 114 is connected to the continuity inspection device 103.

The continuity inspection device 103 is configured to obtain a continuity inspection result of the battery cells 2 under test with the continuity test path 114 connected.

It should be noted that during voltage inspection of a group of positive and negative electrodes of the battery cells 2 under test, another group of positive and negative electrodes of the battery cells 2 under test may be used for continuity inspection. The continuity inspection device 103 may be a module for conducting continuity inspection, or it may be, for example, a voltmeter and other devices capable of inspecting circuit continuity, which is not limited in this embodiment.

The test path corresponding to the continuity inspection device 103 is the continuity test path 114. For example, if continuity inspection is to be performed on the first battery cell 21 under test in the battery cells 2 under test, the input end of the continuity test path 114 is connected to the second test terminal 31*a*2 corresponding to the positive electrode and the second test terminal 32*c*2 corresponding to the negative electrode of the first battery cell 21 under test, and the output end of the continuity test path 114 is connected to the continuity inspection device 103. Thereby, the signal output from the first battery cell 21 under test is transmitted to the continuity inspection device 103, and continuity inspection is performed on the first battery cell 21 under test through the continuity inspection device 103.

The input ends of the insulation test path 111, the voltage test path 112, and the continuity test path 114 are connected to the corresponding test terminals of the battery cells 2 under test all through the multiplexing path 113, thus, insulation inspection, voltage inspection, and continuity inspection of the battery cells 2 under test can be implemented by using one multiplexing path 113, realizing circuit multiplexing and saving design costs.

In the technical solution of the embodiments of this application, the continuity inspection device 103 and the corresponding continuity test path 114 are further disposed in the inspection circuit 1, so that a continuity test can be performed between the positive and negative electrodes of the battery cells 2 under test. The voltage and continuity test of the battery cells 2 under test can be performed synchronously, shortening the testing time of the battery cells 2 under test.

It should be understood that during continuity inspection of the battery cells 2 under test, the continuity between the test terminals 31 corresponding to the positive electrodes and the test terminals 32 corresponding to the negative electrodes of the battery cells 2 under test is tested. Therefore, a path for the test terminal 31 corresponding to the positive electrode and a path for the test terminal 32 corresponding to the negative electrode may be separately provided for the continuity test path 114. For example, when continuity inspection is to be performed on the first battery cell 21 under test in the battery cells 2 under test, the continuity test path 114 is separately provided at the test terminal 31*a*2 corresponding to the positive electrode and the second test terminal 32*c*2 corresponding to the negative electrode of the first battery cell 21 under test, so that the corresponding test paths can be controlled separately.

Figure 9:
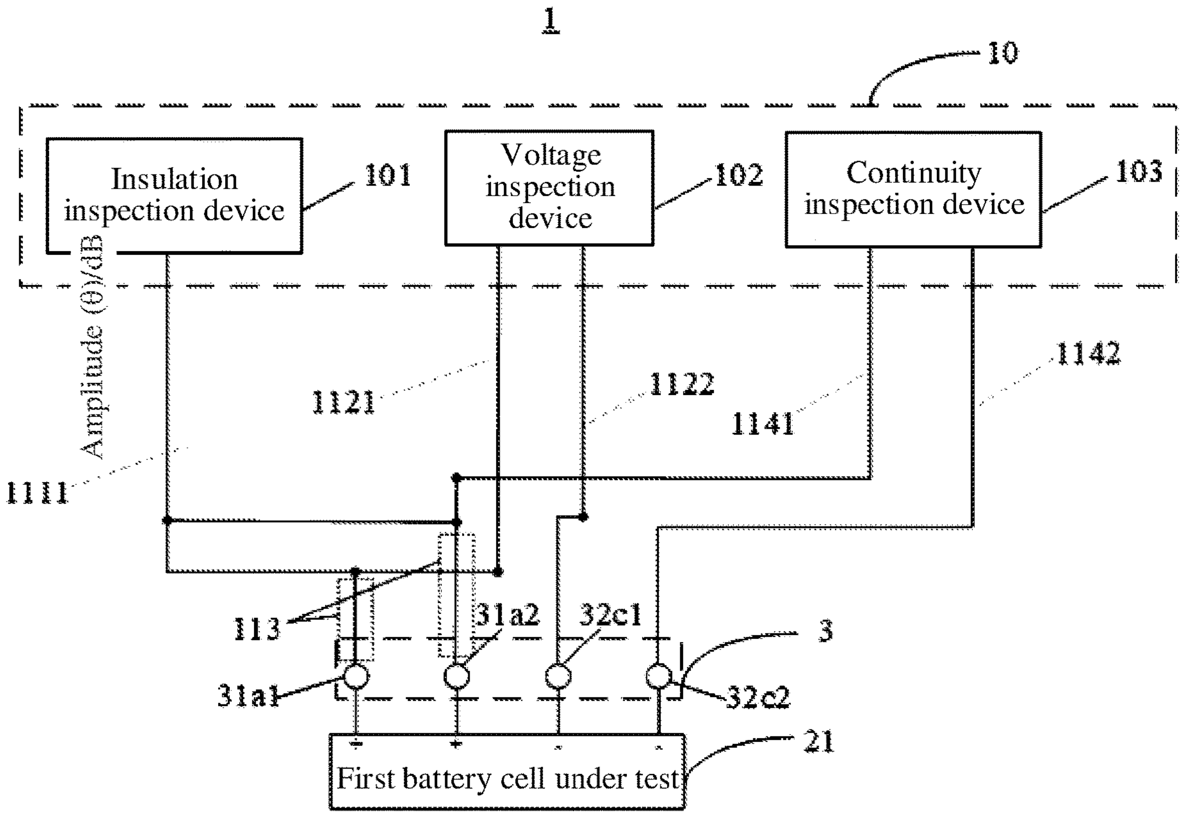
FIG. 9 is another schematic structural diagram of an inspection circuit according to an embodiment of this application.

As shown in FIG. 9, in some embodiments, the continuity test path 114 includes a first continuity test path 1141 and a second continuity test path 1142.

An input end of the first continuity test path 1141 is connected to the second test terminals 31*a*2 corresponding to the positive electrodes of the battery cells 2 under test through the multiplexing path 113, and an output end of the first continuity test path 1141 is connected to the continuity inspection device 103.

An input end of the second continuity test path 1142 is connected to the second test terminals 32*c*2 corresponding to the negative electrodes of the battery cells 2 under test, and an output end of the second continuity test path 1142 is connected to the continuity inspection device 103.

It should be noted that the first test terminals 31*a*1 corresponding to the positive electrodes of the battery cells 2 under test and the first test terminals 32*cl* corresponding to the negative electrode of the battery cells 2 under test are both connected to corresponding voltage test paths 112, therefore, the input end of the first continuity test path 1141 may be configured as being connected to the second test terminals 31*a*2 corresponding to the positive electrodes of the battery cells 2 under test, and the input end of the second continuity test path 1142 may be configured as being connected to the second test terminals 32*c*2 corresponding to the negative electrodes of the battery cells 2 under test, thereby forming a continuity inspection circuit.

For example, if the battery cell 2 under test is the first battery cell 21 under test, during continuity inspection of the first battery cell 21 under test, the input end of the first continuity test path 1141 may be connected to the second test terminal 31*a*2 corresponding to the positive electrode of the first battery cell 21 under test, and the input end of the second continuity test path 1142 may be connected to the second test terminal 32*c*2 corresponding to the negative electrode of the first battery cell 21 under test.

In the technical solution of the embodiments of this application, the first continuity test path 1141 and the second continuity test path 1142 are disposed in the continuity test path 114. The first continuity test path 1141 is connected to the test terminals 3 corresponding to the positive electrodes of the battery cells 2 under test through the multiplexing path 113. The second continuity test path 1142 is connected to the test terminals 3 corresponding to the negative electrodes of the battery cells 2 under test. Thus, a continuity inspection circuit is formed between the first continuity test path 1141, the second continuity test path 1142, the positive and negative electrodes of the battery cells 2 under test, and the continuity inspection device 103, implementing automated continuity inspection of the battery cells 2 under test.

Optionally, to facilitate continuity switching of the continuity test path 114, a switch array may be separately provided on the first continuity test path 1141 and the second continuity test path 1142, so as to switch the connected paths via the switch array.

Figure 10:
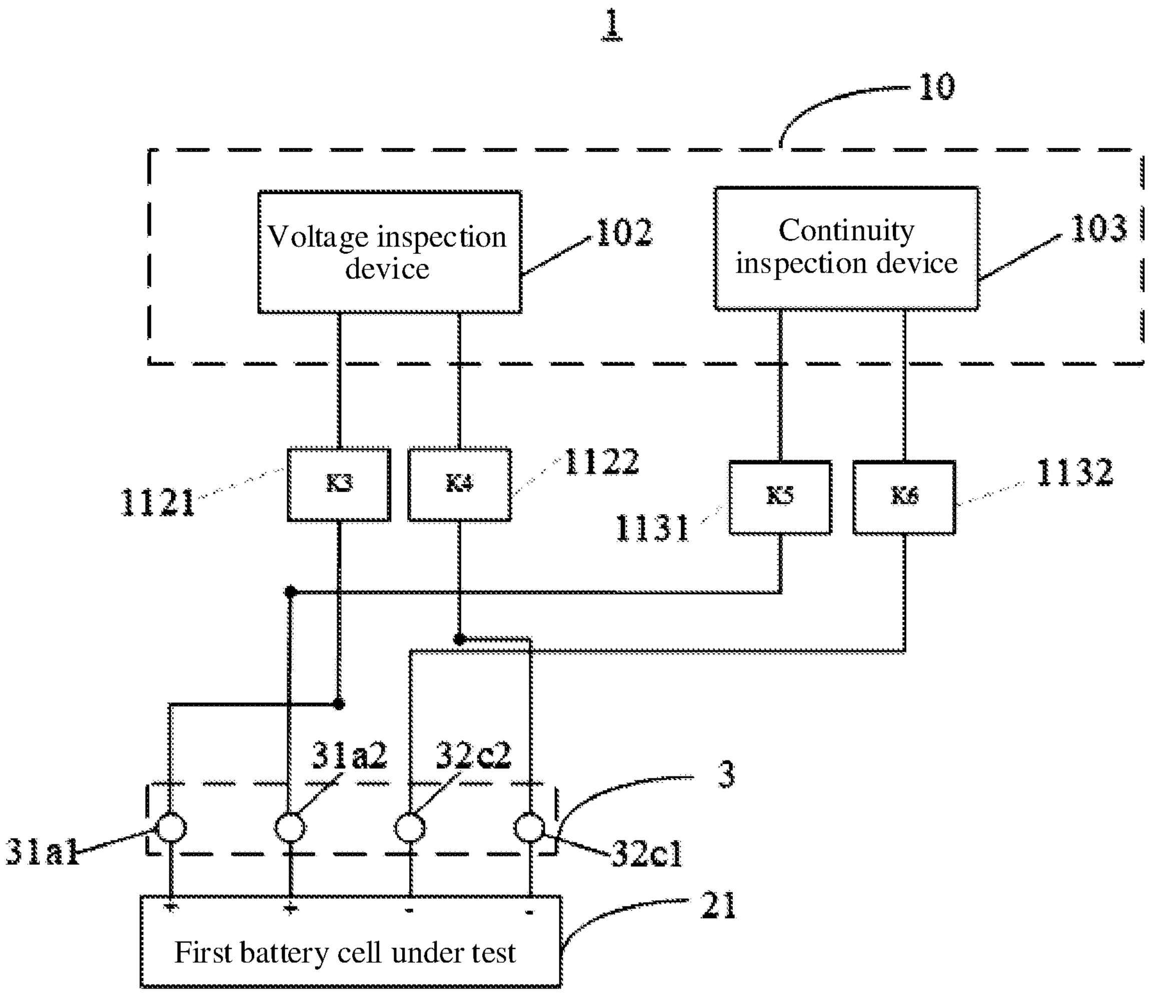
FIG. 10 is another schematic structural diagram of an inspection circuit in which a voltage inspection device and a continuity inspection device are connected to a battery cell under test according to an embodiment of this application.

In some embodiments, as shown in FIG. 10, the pathway switching circuit 11 further includes a fifth switch array K5 and a sixth switch array K6.

The fifth switch array K5 is disposed in the first continuity test path 1141, an input end of the fifth switch array K5 is connected to the second test terminals 31*a*2 corresponding to the positive electrodes of the battery cells 2 under test through the multiplexing path 113, and an output end of the fifth switch array K5 is connected to the continuity inspection device 103.

The sixth switch array K6 is disposed in the second continuity test path 1142. An input end of the sixth switch array K6 is connected to the second test terminals 32*c*2 corresponding to the negative electrodes of the battery cells 2 under test, and an output end of the sixth switch array K6 is connected to the continuity inspection device 103.

It should be understood that the quantity of switches in the fifth switch array K5 and the sixth switch array K6 may be two or more. The fifth switch array K5 is disposed in the first continuity test path 1141 such that a circuit loop of the first continuity test path 1141 can be connected or disconnected through the fifth switch array K5. An input end of the fifth switch array K5 is connected to second test terminals 31*a*2 corresponding to the positive electrodes of the battery cells 2 under test, and an output end of the fifth switch array K5 is connected to the continuity inspection device 103.

The sixth switch array K6 is disposed in the second continuity test path 1142, so that a circuit loop of the second continuity test path 1142 can be connected or disconnected through the sixth switch array K6. An input end of the sixth switch array K6 is connected to the second test terminals 32*c*2 corresponding to the negative electrodes of the battery cells 2 under test, and an output end of the sixth switch array K6 is connected to the continuity inspection device 103.

The fifth switch array K5 and the sixth switch array K6 are configured to be closed during continuity test of the battery cells 2 under test, connecting the second test terminals 31*a*2 corresponding to the positive electrodes of the battery cells 2 under test to the continuity inspection device 103, and connecting the second test terminals 32*c*2 corresponding to the negative electrodes of the battery cells 2 under test to the continuity inspection device 103.

Optionally, a plurality of switches may be provided in the fifth switch array K5, so as to control the continuity of the first continuity test path 1141 through the switches. The switches may be transistors such as triodes, MOS transistors, and other switching devices such as relays. A plurality of switches may further be provided in the sixth switch array K6. The quantity of switches of the fifth switch array K5 and the sixth switch array K6 may correspond to each other. The continuity of the second continuity test path 1142 can be controlled through the switches. For example, when the current battery cell 2 under test is the first battery cell 21 under test, during continuity test of the first battery cell 21 under test, the fifth switch array K5 and the sixth switch array K6 are both closed, connecting the second test terminal 31*a*2 corresponding to the positive electrode of the first battery cell 21 under test to the continuity inspection device 103, and connecting the second test terminal 32*c*2 corresponding to the negative electrode of the first battery cell 21 under test to the continuity inspection device 103.

For the battery cells 2 under test, the first test terminals 31*a*1 corresponding to the positive electrodes, the second test terminals 31*a*2 corresponding to the positive electrodes, the first test terminals 32*cl* corresponding to the negative electrodes, and the second test terminals 32*c*2 corresponding to the negative electrodes are all connected to corresponding test paths. Therefore, voltage inspection and continuity inspection can be simultaneously performed on the battery cells under test. During voltage and continuity inspection of the battery cells 2 under test, the third switch array K3 and the fourth switch array K4 connect the first voltage test path 1121 and the second voltage test path 1122, respectively; the fifth switch array K5 and the sixth switch array K6 connect the first continuity test path 1141 and the second continuity test path 1142, respectively. At the same time, the first switch array K1 and the second switch array K2 disconnect the corresponding first insulation test path 1111 and the second insulation test path 1112, respectively.

In the technical solution of the embodiments of this application, the fifth switch array K5 and the sixth switch array K6 are further disposed in the pathway switching circuit 11. The fifth switch array K5 is disposed in the first continuity test path 1141, and the sixth switch array K6 is disposed in the second continuity test path 1142, and they are closed during continuity test between the positive and negative electrodes of the battery cells 2 under test, implementing automated test of the continuity between another group of positive and negative electrodes of the battery cells 2 under test.

Due to frequent use, the multiplexing path 113 may be short-circuited during use. To facilitate the control of the multiplexing path 113, a switch may be disposed in the multiplexing path 113 so as to directly control the connection/disconnection of the multiplexing path 113 via the switch when a problem occurs.

Figure 11:
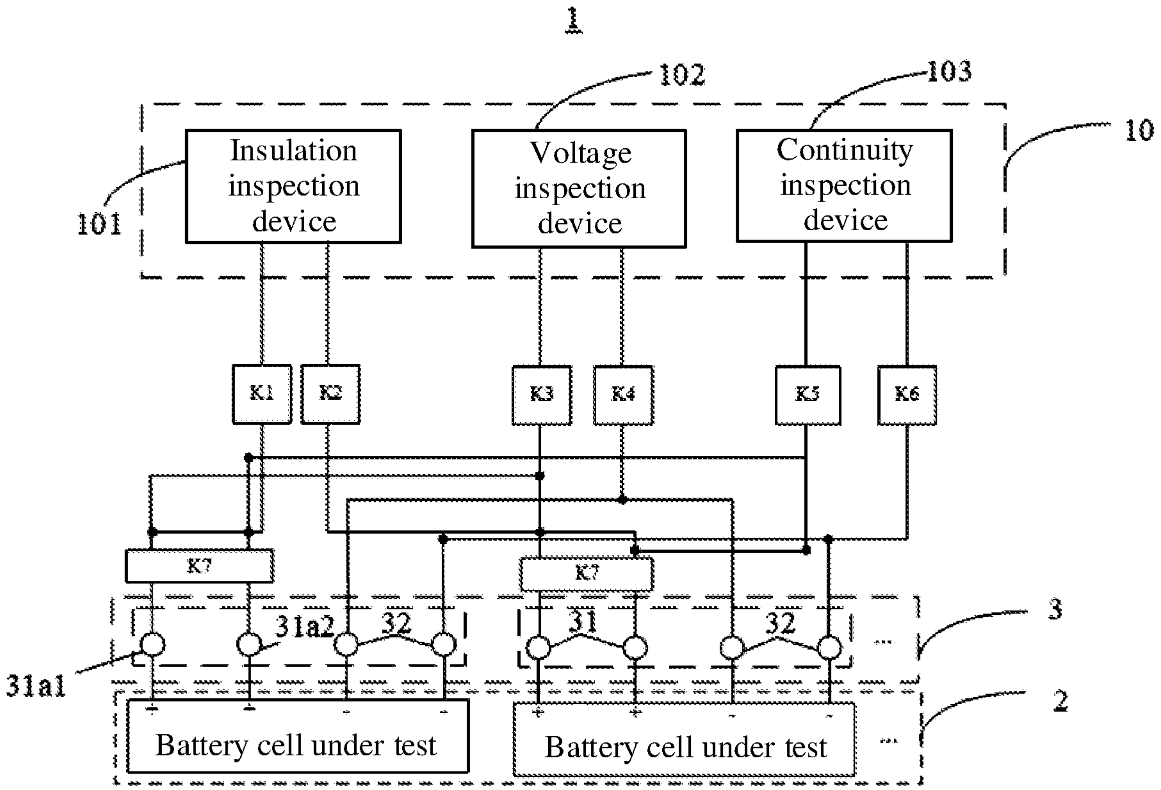
FIG. 11 is another schematic structural diagram of an inspection circuit according to an embodiment of this application.

In some embodiments, as shown in FIG. 11, the pathway switching circuit 11 further includes a seventh switch array K7.

The seventh switch array K7 is disposed in the multiplexing path 113, an input end of the seventh switch array K7 is connected to the test terminals 31*a* corresponding to the positive electrodes of the battery cells 2 under test, and an output end of the seventh switch array K7 is connected to the input end of the insulation test path 111, the input end of the voltage test path 112, and the input end of the continuity test path 114.

The seventh switch array K7 is closed during inspection of the battery cells 2 under test, connecting the test terminal 31*a* corresponding to the positive electrodes of the battery cells 2 under test and a corresponding test path.

In the technical solution of the embodiments of this application, the seventh switch array K7 is disposed in the multiplexing path 113, so that continuity of the multiplexing path 113 can be controlled through the seventh switch array K7.

It should be noted that, during inspection of the battery cells 2 under test, the inspection device 10 may be configured as inspecting a plurality of battery cells 2 under test to improve the test efficiency.

In some embodiments, the pathway switching circuit 11 further includes an inspection switching path, and the battery cells 2 under test include a first group of battery cells A1 under test and a second group of battery cells B1 under test.

It should be understood that both the first group of battery cells A1 under test and the second group of battery cells B1 under test include a plurality of battery cells 2 under test. The inspection device 10 is connected to the test terminals 3 corresponding to the battery cells 2 under test in the first group of battery cells A1 under test through the inspection switching path, and the group inspection device 10 is also connected to the test terminals 3 corresponding to the battery cells 2 under test in the second group of battery cells B1 under test through the inspection switching path.

During inspection of a group of battery cells 2 under test, the inspection switching path can connect the corresponding group of battery cells 2 under test to the inspection device 10, and disconnect the remaining groups of battery cells 2 under test from the inspection device 10.

An input end of the inspection switching path is connected to test terminals 3 corresponding to the first group of battery cells A1 under test and test terminals 3 corresponding to the second group of battery cells B1 under test, and an output end of the inspection switching path is connected to the inspection device 10.

The inspection switching path is configured to connect the test terminals corresponding to the first group of battery cells A1 under test to the inspection device 10 when the first group of battery cells A1 are being inspected.

The inspection switching path is also configured to connect the test terminals corresponding to the second group of battery cells B1 under test to the inspection device 10 when the second group of battery cells B1 under test are being inspected.

In the technical solution of the embodiments of this application, the inspection switching path can be used to switch the state of connectivity between the test terminal corresponding to a different group of battery cells under test and the inspection device, improving the inspection efficiency.

In some embodiments, to improve the control effect, the inspection switching path includes a first inspection switching path and a second inspection switching path.

An input end of the first inspection switching path is connected to the test terminals 3 corresponding to the first group of battery cells A1 under test, and an output end of the first inspection switching path is connected to the inspection device 10. An input end of the second inspection switching path is connected to the test terminals 3 corresponding to the second group of battery cells B1 under test, and an output end of the second inspection switching path is connected to the inspection device 10.

A corresponding inspection switching path is disposed in a circuit loop of a different group of battery cells 2 under test and the inspection device 10, a flexible switching can be performed using the inspection switching paths.

The first inspection switching path and the second inspection switching path are disposed in the inspection switching path. The input end of the first inspection switching path is connected to the test terminals 3 corresponding to the first group of battery cells A1 under test, and the output end is connected to the inspection device 10. Therefore, when inspection is to be performed on the first group of battery cells A1 under test, switching is performed to connect the test terminals 3 corresponding to the first group of battery cells A1 under test to the inspection device 10. The input end of the second inspection switching path is connected to the test terminals 3 corresponding to the second group of batteries B1 under test, and the output end is connected to the inspection device 10. Therefore, when inspection is to be performed on the second group of batteries B1 under test, switching is performed to connect the test terminals 3 corresponding to the second group of batteries B1 under test to the inspection device 10. Thus, automated pathway switching for inspection of different groups of batteries is implemented.

Figure 12:
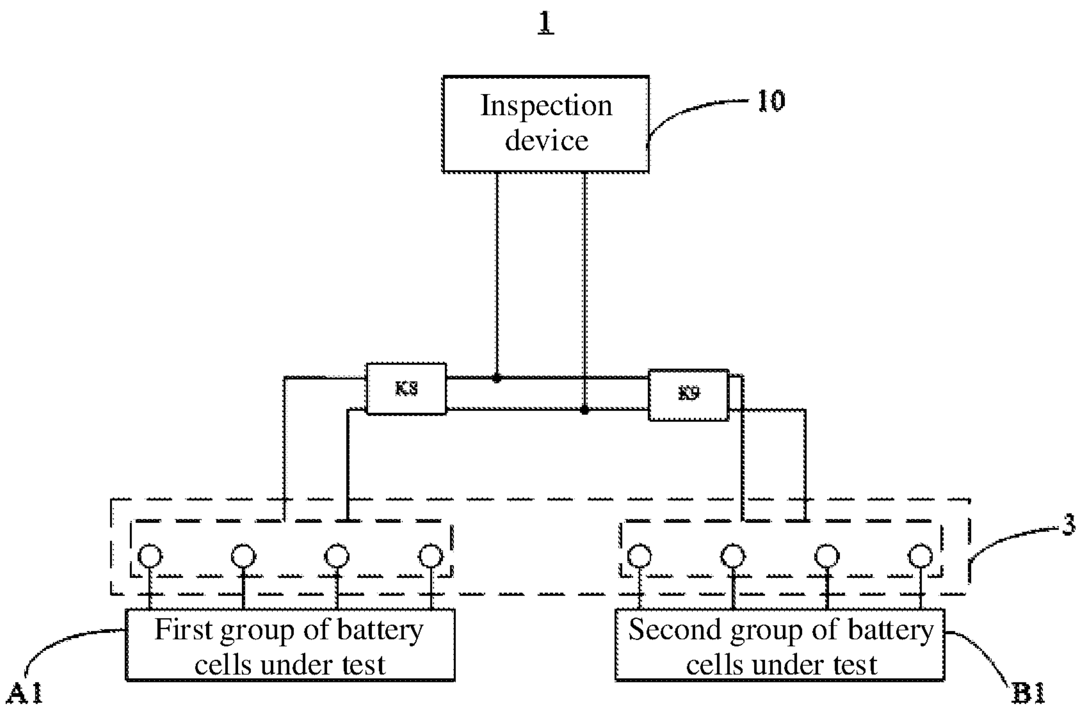
FIG. 12 is another schematic structural diagram of an inspection circuit according to an embodiment of this application.

In some embodiments, as shown in FIG. 12, the pathway switching circuit 11 further includes an eighth switch array K8 and a ninth switch array K9.

The eighth switch array K8 is disposed in the first inspection switching path, an input end of the eighth switch array K8 is connected to the test terminals 3 corresponding to the first group of battery cells A1 under test, and an output end of the eighth switch array K8 is connected to the inspection device 10.

The ninth switch array K9 is disposed in the second inspection switching path, an input end of the ninth switch array K9 is connected to the test terminals 3 corresponding to the second group of battery cells B1 under test, and an output end of the ninth switch array K9 is connected to the inspection device 10.

It should be understood that the quantity of switches in the eighth switch array K8 and the ninth switch array K9 may be two or more. The eighth switch array K8 is disposed in the first inspection switching path such that a circuit loop of the first inspection switching path can be connected or disconnected through the eighth switch array K8. An input end of the first inspection switching path is connected to the test terminals 3 corresponding to the first group of battery cells A1 under test; and an output end of the first inspection switching path is connected to the inspection device 10.

The ninth switch array K9 is disposed in the second inspection switching path such that a circuit loop of the second inspection switching path can be connected or disconnected through the ninth switch array K9. An input end of the ninth switch array K9 is connected to the test terminals 3 corresponding to the second group of battery cells B1 under test, and an output end of the ninth switch array K9 is connected to the inspection device 10.

The eighth switch array K8 is closed during testing of the first group of battery cells A1 under test, connecting the test terminals 3 corresponding to the first group of battery cells A1 under test to the inspection device 10; and the ninth switch array K9 is closed during testing of the second group of battery cells B1 under test, connecting the test terminals 3 corresponding to the second group of battery cells B1 under test to the inspection device 10.

Optionally, a plurality of switches may be provided in the eighth switch array K8, so as to control the continuity of the first inspection switching path through the switches. The switches may be transistors such as triodes, MOS transistors, and other switching devices such as relays. A plurality of switches may further be provided in the eighth switch array K8. The quantity of switches of the eighth switch array K8 and the ninth switch array K9 may correspond to each other. The continuity of the second inspection switching path can be controlled through the switches. For example, when the current battery cells 2 under test is the first group of battery cells A1 under test, during inspection of the first group of battery cells A1 under test, the eighth switch array K8 is closed, connecting the test terminal 3 corresponding to the first group of battery cells A1 under test to the inspection device 10.

In the technical solution of the embodiments of this application, the eighth switch array K8 and the ninth switch array K9 are disposed in the pathway switching circuit 11. The eighth switch array K8 is disposed in the first inspection switching path. The ninth switch array K9 is disposed in the second inspection switching path. Therefore, during testing of different groups of battery cells 2 under test, switching between different inspection paths can be performed for connection, implementing automation and flexible switching between testing of different groups of battery cells 2 under test.

When one group of inspection devices 10 is used to inspect a plurality groups of battery cells 2 under test, inspection switching paths are required for inspection switching. Frequent switching may easily lead to circuit failures. Therefore, a corresponding inspection device 10 can be provided for each group of battery cells 2 under test, avoiding frequent switching.

In some embodiments, the inspection device 10 includes a first group of inspection devices and a second group of inspection devices.

It should be understood that the first group of inspection devices and the second group of inspection devices may both include inspection devices of a variety of inspection types, such as insulation inspection devices, voltage inspection devices, continuity inspection devices, and the like. Other types of inspection device may be added according to the testing requirements.

An input end of the inspection switching path is connected to the test terminals corresponding to the first group of battery cells A1 under test and the test terminals corresponding to the second group of battery cells B1 under test, and the output end of the inspection switching path is connected to the first group of inspection devices and the second group of inspection devices.

The inspection switching path is configured to connect the test terminals 3 corresponding to the first group of battery cells A1 under test to the first group of inspection devices when the first group of battery cells under test are being inspected.

The inspection switching path is also configured to connect the test terminals 3 corresponding to the second group of battery cells B1 under test to the second group of inspection devices when the second group of battery cells B1 under test are being inspected.

It should be noted that, when insulation test needs to be performed on the first group of battery cells A1 under test through the first group of inspection devices, the insulation inspection device 101 in the first group of inspection devices can be connected to the first group of battery cells A1 under test through the inspection switching path. At this time, insulation inspection or the rest types of inspection can be performed on the second group of battery cells B1 under test through the second group of inspection devices; and the second group of inspection devices can be connected to the second group of battery cells B1 under test through the inspection switching path. The first group of inspection devices and the second group of inspection devices can be used to simultaneously perform the same type or different types of inspection on the first group of battery cells A1 under test and the second group of battery cells B1 under test.

In the technical solution of the embodiments of this application, the first group of inspection devices and the second group of inspection devices are provided as the inspection device. The input end of the inspection switching path is connected to the test terminals 3 corresponding to the first group of batteries A1 under test and the test terminals 3 corresponding to the second group of batteries B1 under test. The output end of the inspection switching path is connected to the first group of inspection devices and the second group of inspection devices. Therefore, during inspection of different groups of battery cells 2 under test, switching between different inspection circuits can be performed through the inspection switching pathway so as to inspect a plurality of groups of battery cells 2 under test, improving the inspection efficiency.

In some embodiments, the inspection signal includes a first inspection signal.

The inspection switching path is also configured to connect, according to the first inspection signal, the test terminals 3 corresponding to the first group of battery cells A1 under test to the first group of inspection devices.

The first group of inspection devices is configured to obtain an inspection result of the first group of battery cells A1 under test with the test terminals 3 corresponding to the first group of battery cells A1 under test connected to the first group of inspection devices.

It should be understood that an inspection switching path may further be provided between the first group of inspection devices and the second group of inspection devices. When the first group of inspection devices is in operation, the inspection switching path disconnects the circuit loop of the second group of inspection devices and the corresponding battery cells 2 under test.

The first inspection signal is a signal for the first group of inspection devices to operate and perform inspection. When the first inspection signal is received, the inspection switching path connects the first group of battery cells A1 under test to the first group of inspection devices, so that the first group of inspection devices are used to inspect the first group of battery cells A1 under test to obtain an inspection result. The inspection result may include an insulation inspection result, a voltage inspection result, a continuity inspection result, and the like of the first group of battery cells A1 under test.

In the technical solution of the embodiments of this application, according to the first inspection signal, the inspection switching path connects the test terminals 3 corresponding to the first group of battery cells A1 under test to the first group of inspection devices, so that inspection on the first group of battery cells A1 under test can be performed through the first group of inspection devices and the inspection result can be obtained, thereby implementing rapid inspection of the first group of battery cells A1 under test.

In some embodiments, the inspection signal further includes a second inspection signal.

The inspection switching path is also configured to connect, according to the second inspection signal, the test terminals 3 corresponding to the second group of battery cells B1 under test to the second group of inspection devices.

The second group of inspection devices is configured to obtain an inspection result of the second group of battery cells B1 under test with the test terminals 3 corresponding to the second group of battery cells B1 under test connected to the second group of inspection devices.

It should be understood that when the second group of inspection devices is in operation, the inspection switching path disconnects the circuit loop of the first group of inspection devices and the corresponding battery cells 2 under test.

The second inspection signal is a signal for the second group of inspection devices to operate and perform inspection. When the second inspection signal is received, the inspection switching path connects the second group of battery cells B1 under test to the second group of inspection devices, so that the second group of inspection devices are used to inspect the second group of battery cells B1 under test to obtain an inspection result. The inspection result may include an insulation inspection result, a voltage inspection result, a continuity inspection result, and the like of the second group of battery cells B1 under test.

In the technical solution of the embodiments of this application, according to the second inspection signal, the inspection switching path can connect the test terminals 3 corresponding to the second group of battery cells B1 under test to the second group of inspection devices, so that inspection on the second group of battery cells B1 under test can be performed through the second group of inspection devices and the inspection result can be obtained, thereby implementing rapid inspection of the second group of battery cells B1 under test.

It should be noted that when the inspection device 10 is used to inspect the battery cells 2 under test, a certain amount of interference signals may be generated, which may affect the inspection results. Therefore, an anti-interference circuit can be additionally provided in the inspection circuit 1 to improve the accuracy of the inspection.

Figure 13:
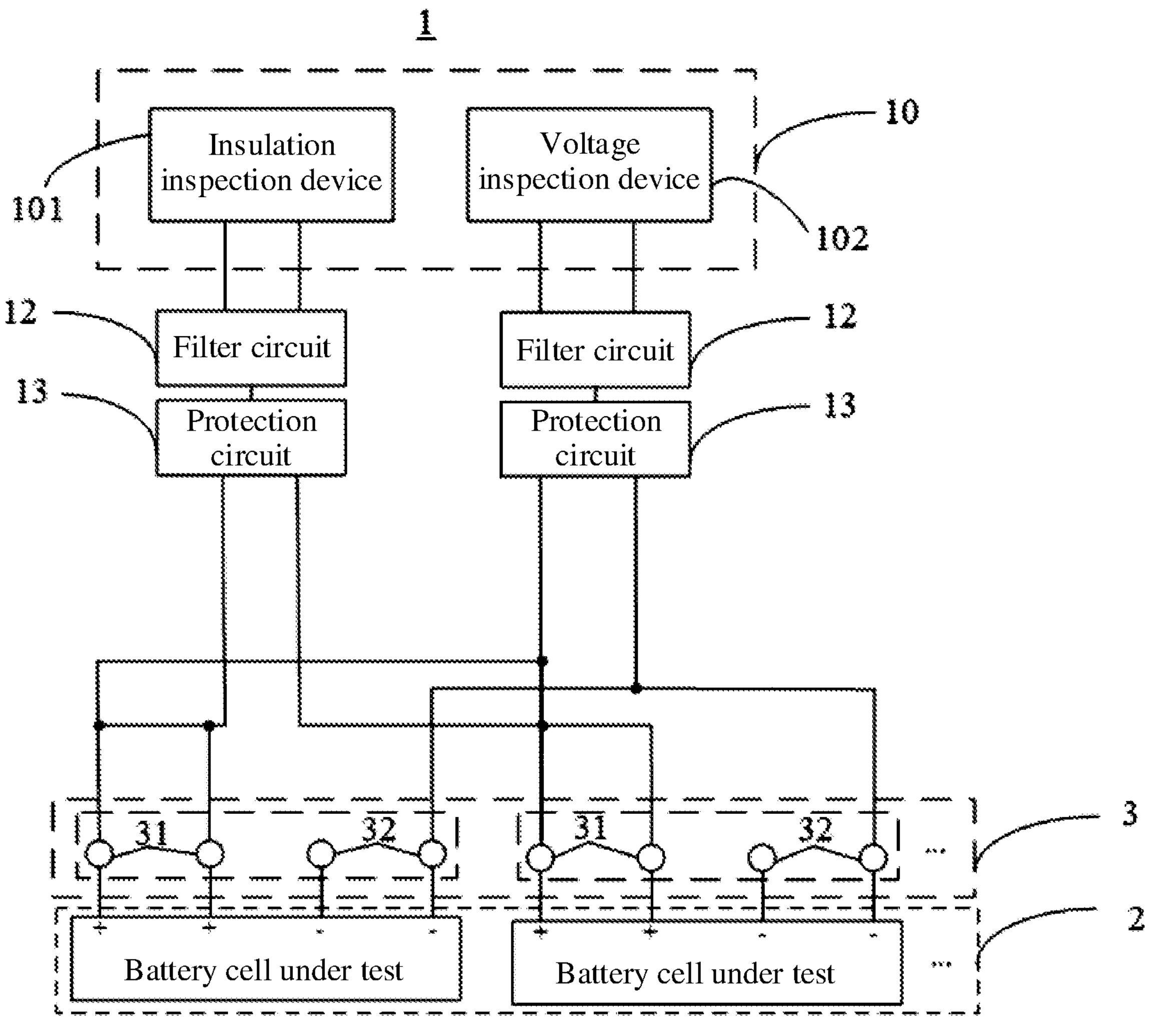
FIG. 13 is another schematic structural diagram of an inspection circuit according to an embodiment of this application.

In some embodiments, as shown in FIG. 13, the inspection circuit 1 further includes a filter circuit 12.

The first end of the filter circuit 12 is connected to the inspection device 10, and the second end of the filter circuit 12 is connected to the pathway switching circuit 11. The filter circuit 12 is configured to perform filtering during inspection of the battery cells 2 under test.

It should be noted that the filter circuit 12 may be a filter composed of one or more of capacitors, magnetic rings, inductors, resistors, transistors, and operational amplifiers, or may be other modules that can implement filtering, which is not limited in this embodiment.

In the technical solution of the embodiments of this application, a filter circuit 12 is further disposed in the inspection circuit 1, so as to perform filtering during inspection of the battery cell 2 under test, reducing the interference signal during the inspection.

It should be noted that when the inspection device 10 is used to inspect the battery cell 2 under test, the circuit may be short-circuited due to excessive voltage of the battery cell 2 under test. Therefore, a protection circuit needs to be provided in the inspection circuit to protect the circuit as well as the components in the circuit.

In some embodiments, the inspection circuit 1 further includes a protection circuit 13.

The first end of the protection circuit 13 is connected to the inspection device 10, and the second end of the protection circuit 13 is connected to the pathway switching circuit 11. The protection circuit 13 is configured to provide current limiting protection during inspection of the battery cell 2 under test.

It should be noted that the protection circuit 13 may be an overcurrent protection device including resistors, diodes and other devices. Overcurrent protection is performed through the protection circuit 13, improving the safety of the overall circuit.

In the technical solution of the embodiments of this application, the protection circuit 13 is further disposed in the inspection circuit 1 so as to provide current limiting protection on each component during inspection of the battery cell 2 under test, ensuring the safety of the circuit.

Figure 14:
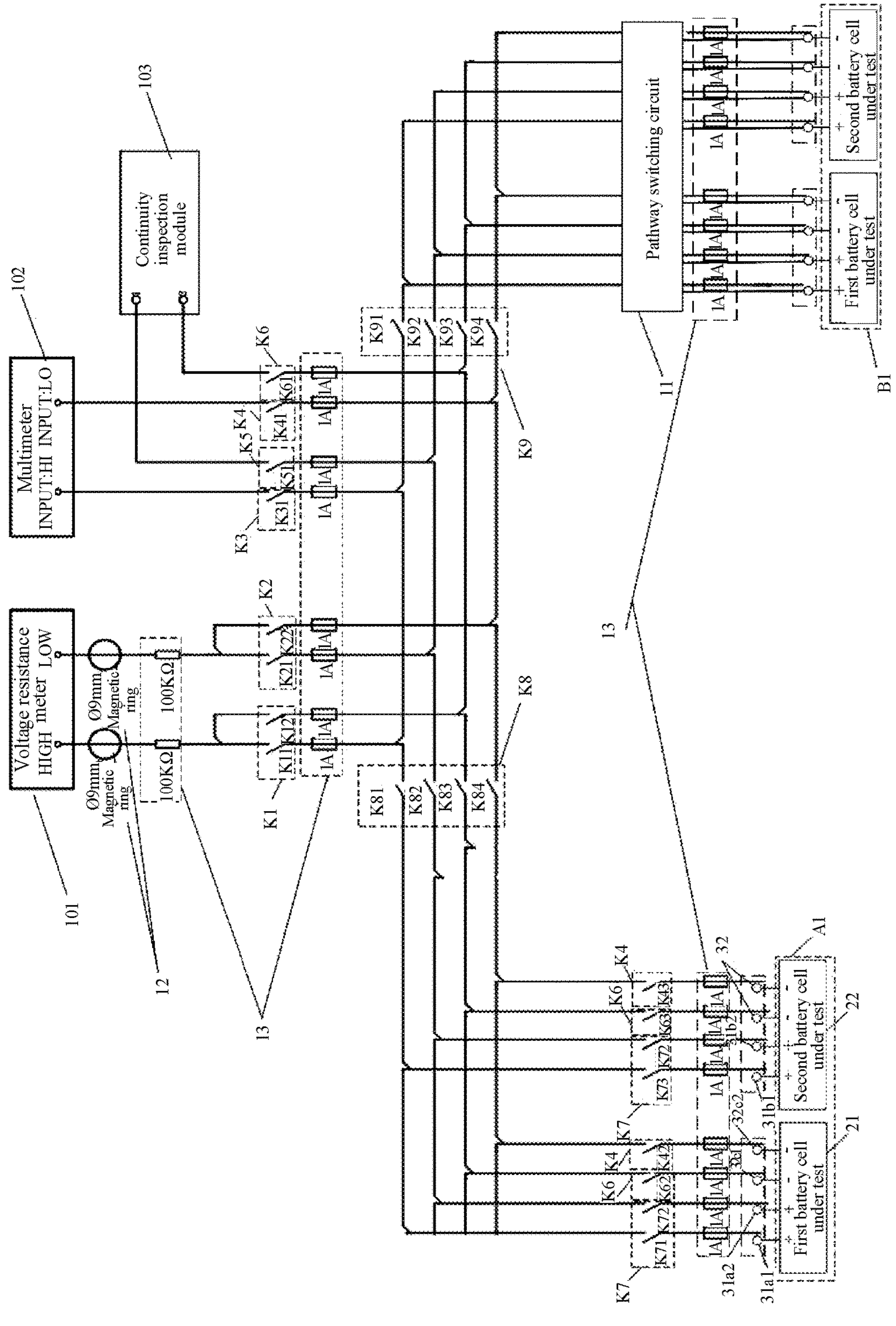
FIG. 14 is a schematic diagram of an overall structure of an inspection circuit according to an embodiment of this application.

In a specific embodiment, as shown in FIG. 14, the battery cell 2 under test includes a first group of battery cells A1 under test and a second group of battery cells A2 under test. The first group of battery cells A1 under test includes a first battery cell 21 under test and a second battery cell 22 under test. The inspection device 10 includes an insulation inspection device 101, a voltage inspection device 102, and a continuity inspection device 103. The insulation inspection device 101 may be a voltage resistance meter. The voltage inspection device 102 may be a multimeter. The continuity inspection device 103 may be a continuity inspection module. The filter circuit 12 may include a magnetic ring. The protection circuit 13 may include a current-limiting resistor. In the inspection path of the first group of battery cells A1 under test, the first switch array K1 may include a first switch K11, and the second switch array K2 may include a second switch K21. The third switch array K3 may include a third switch K31, and the fourth switch array K4 may include a fourth switch K41, a fifth switch K42, and a sixth switch K43. The fifth switch array K5 may include a seventh switch K51, and the sixth switch array K6 may include an eighth switch K61, a ninth switch K62, and a tenth switch K63. The seventh switch array K7 may include an eleventh switch K71, a twelfth switch K72, a thirteenth switch K73, and a fourteenth switch K74. The eighth switch array K8 may include a fifteenth switch K81, a sixteenth switch K82, a seventeenth switch K83, and an eighteenth switch K84. The ninth switch array K9 may include a nineteenth switch K91, a twentieth switch K92, a twenty-first switch K93, and a twenty-second switch K94. The positive and negative electrodes of the battery cells 2 under test may change position. To adapt to the inspection of different positions of the positive electrodes of different battery cells, a twenty-third switch K12 may be additionally provided in the first switch array K1, and a twenty-fourth switch K22 may be additionally provided in the second switch array K2, so as to switch between the circuit test paths of different positive electrodes.

The input ends of the eleventh switch K71 and the twelfth switch K72 are connected to the first test terminal 31*a*1 corresponding to the positive electrode of the first battery cell 21 under test and the second test terminal 31*a*2 corresponding to the positive electrode of the first battery cell 21 under test, respectively. The output end of the eleventh switch K71 is connected to the fifteenth switch K81. The output end of the fifteenth switch K81 is connected to the first switch K11 in the insulation test path 111 and the third switch K31 in the voltage test path 112. The insulation test path 111 and the voltage test path 112 share one switch, that is, the eleventh switch K71.

The output end of the twelfth switch K72 is connected to the sixteenth switch K82, and the output end of the sixteenth switch K82 is connected to the second switch K21 in the insulation test path 111 and the seventh switch K51 in the continuity test path 114, respectively. The insulation test path 111 and the continuity test path 114 share a switch, that is, the twelfth switch K72.

The input ends of the thirteenth switch K73 and the fourteenth switch K74 are connected to the first test terminal 31*b*1 corresponding to the positive electrode of the second battery cell 22 under test and the second test terminal 31*b*2 corresponding to the positive electrode of the second battery cell 22 under test, respectively. The output end of the thirteenth switch K73 is connected to the fifteenth switch K81. The output end of the fifteenth switch K81 is connected to the first switch K11 in the insulation test path 111 and the third switch K31 in the voltage test path 112. The insulation test path 111 and the voltage test path 112 share one switch, that is, the thirteenth switch K73.

The output end of the fourteenth switch K74 is connected to the sixteenth switch K82, and the output end of the sixteenth switch K82 is connected to the second switch K21 in the insulation test path 111 and the seventh switch K51 in the continuity test path 114, respectively. The insulation test path 111 and the continuity test path 114 share a switch, that is, the fourteenth switch K74.

The output ends of the first switch K11 and the twenty-third switch K12 are both connected to the high-voltage output end of the voltage resistance meter. The input end of the first switch K11 is connected to the output end of the fifteenth switch K81 through a current-limiting resistor. The input end of the fifteenth switch K81 is connected to the output end of the eleventh switch K71 and the output end of the thirteenth switch K73. The input end of the eleventh switch K71 is connected to the first test terminal 31*a*1 corresponding to the positive electrode of the first battery cell 21 under test. The input end of the thirteenth switch K73 is connected to the first test terminal 31*b*1 corresponding to the positive electrode of the second battery cell 22 under test. The input end of the twenty-third switch K12 is connected to the output end of the seventeenth switch K83 through a current-limiting resistor. The input end of the seventeenth switch K83 is connected to the output end of the ninth switch K62 and the output end of the tenth switch K63. The input end of the ninth switch K62 is connected to the second test terminal 32_c_2 corresponding to the negative electrode of the first battery cell 21 under test. The input end of the tenth switch K63 is connected to the second test terminal corresponding to the negative electrode of the second battery cell 22 under test.

The output ends of the second switch K21 and the twenty-fourth switch K22 are both connected to the low-voltage input end of the voltage resistance meter. The input end of the second switch K21 is connected to the output end of the sixteenth switch K82 through a current-limiting resistor. The input end of the sixteenth switch K82 is connected to the output end of the twelfth switch K72 and the output end of the fourteenth switch K74. The input end of the twelfth switch K72 is connected to the second test terminal 31_a_2 corresponding to the positive electrode of the first battery cell 21 under test. The input end of the fourteenth switch K74 is connected to the second test terminal 31_b_2 corresponding to the positive electrode of the second battery cell 22 under test. The input end of the twenty-fourth switch K22 is connected to the output end of the eighteenth switch K84 through a current-limiting resistor. The input end of the eighteenth switch K84 is connected to the first test terminal 32_cl_ corresponding to the negative electrode of the first battery cell 21 under test and the first test terminal corresponding to the negative electrode of the second battery cell 22 under test.

The output end of the third switch K31 is connected to the high-voltage input end of the multimeter. The input end of the third switch K31 is connected to the output end of the fifteenth switch K81 through a current-limiting resistor. The input end of the fifteenth switch K81 is connected to the output end of the eleventh switch K71 and the output end of the thirteenth switch K73. The input end of the eleventh switch K71 is connected to the first test terminal 31_a_1 corresponding to the positive electrode of the first battery cell 21 under test. The input end of the thirteenth switch K73 is connected to the first test terminal 31_b_1 corresponding to the positive electrode of the second battery cell 22 under test.

The output end of the fourth switch K41 is connected to the low-voltage input end of the multimeter. The input end of the fourth switch K41 is connected to the output end of the eighteenth switch K84 through a current-limiting resistor. The input end of the eighteenth switch K84 is connected to the first test terminal 32_cl_ corresponding to the negative electrode of the first battery cell 21 under test, and the first test terminal corresponding to the negative electrode of the second battery cell 22 under test.

The output end of the seventh switch K51 is connected to the first end of the continuity inspection module. The input end of the seventh switch K51 is connected to the output end of the sixteenth switch K82 through a current-limiting resistor. The input end of the sixteenth switch K82 is connected to the output end of the twelfth switch K72 and the output end of the fourteenth switch K74. The input end of the twelfth switch K72 is connected to the second test terminal 31_a_2 corresponding to the positive electrode of the first battery cell 21 under test. The input end of the fourteenth switch K74 is connected to the second test terminal 31_b_2 corresponding to the positive electrode of the second battery cell 22 under test.

The output end of the eighth switch K61 is connected to the second end of the continuity inspection module. The input end of the eighth switch K61 is connected to the output end of the seventeenth switch K83 through a current-limiting resistor. The input end of the seventeenth switch K83 is connected to the output end of the ninth switch K62 and the output end of the tenth switch K63. The input end of the ninth switch K62 is connected to the second test terminal 32_c_2 corresponding to the negative electrode of the first battery cell 21 under test. The input end of the tenth switch K63 is connected to the second test terminal corresponding to the negative electrode of the second battery cell 22 under test.

When the voltage resistance meter is in operation, the first switch K11, the fifteenth switch K81, the eleventh switch K71 are closed. The first insulation test path 1111 connects the first test terminal 31_a_1 corresponding to the positive electrode of the first battery cell 21 under test to the high-voltage output end of the voltage resistance meter. The second switch K21, the sixteenth switch K82, and the fourteenth switch K74 are closed. The second insulation test path 1112 connects the second test terminal 31_b_2 corresponding to the positive electrode of the second battery cell 22 under test to the low-voltage input end of the voltage resistance meter. Thus, insulation inspection is simultaneously performed between the positive electrodes of the first battery cell 21 under test and the second battery cell 22 under test through the voltage-resistant meter. Closing the second switch K21, the sixteenth switch K82, and the twelfth switch K72 can connect the low-voltage input end of the voltage resistance meter to the second test terminal 31_a_2 corresponding to the positive electrode of the first battery cell 21 under test. Closing the first switch K11, the fifteenth switch K81, and the thirteenth switch K73 can connect the high-voltage output end of the voltage resistance meter to the first test terminal 32_b_1 corresponding to the positive electrode of the second battery cell 22 under test. In this way, insulation inspection can be performed between the positive electrodes of the first battery cell 21 under test and the second battery cell 22 under test through the voltage resistance meter.

When voltage and continuity inspection need to be performed on the first battery cell 21 under test, the third switch K31, the fifteenth switch K81, and the eleventh switch K71 are closed, connecting the high-voltage input end of the multimeter to the first test terminal 31_a_1 corresponding to the positive electrode of the first battery cell 21 under test; and the fourth switch K41, the eighteenth switch K84, and the fifth switch K42 are closed, connecting the low-voltage input end of the multimeter to the first test terminal 32_cl_ corresponding to the negative electrode of the first battery cell 21 under test. The seventh switch K51, the sixteenth switch K82, and the twelfth switch K72 are closed, connecting the first end of the continuity inspection module to the second test terminal 31_a_2 corresponding to the positive electrode of the first battery cell 21 under test. The eighth switch K61, the seventeenth switch K83, and the ninth switch K62 are closed, connecting the second end of the continuity inspection module to the second test terminal 32_c_2 corresponding to the negative electrode of the first battery cell 21 under test. In this way, voltage inspection and circuit continuity inspection can be simultaneously performed on the first battery cell 21 under test.

The inspection circuit 1 as designed above can implement compatibility with different insulation test circuits between the positive electrodes of the battery cells 2 under test, and can also implement synchronized voltage test and circuit continuity test on battery cells 2 under test, improving the test efficiency and realizing automated test of the battery cells under test.

Figure 15:
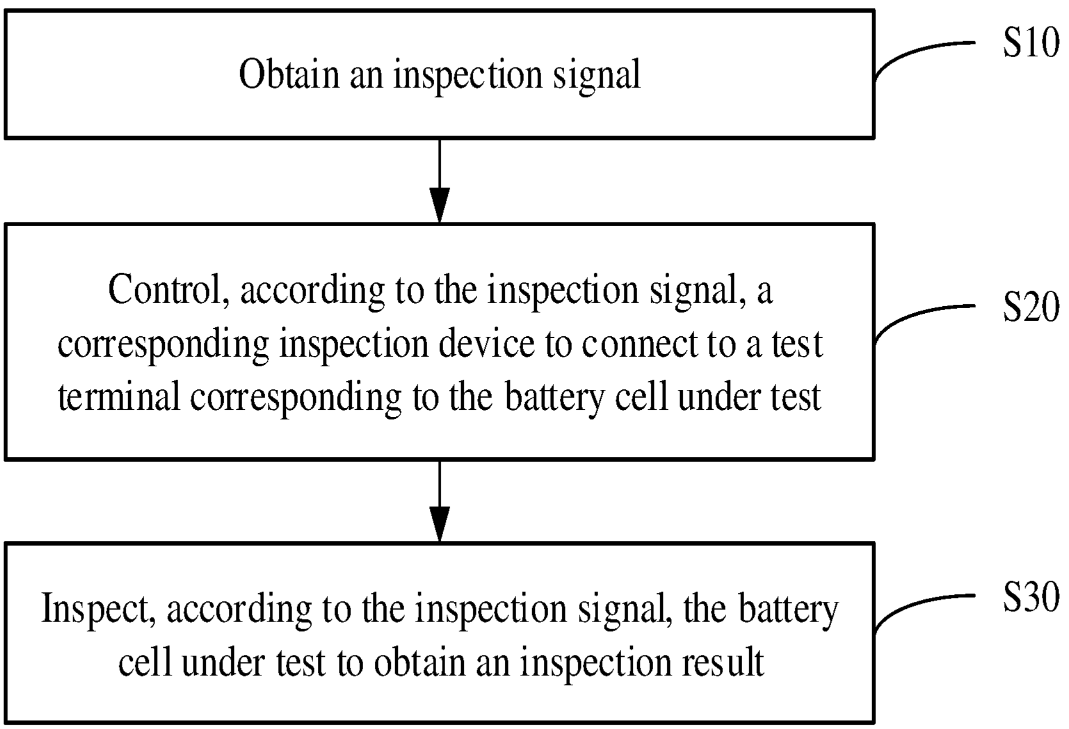
FIG. 15 is a schematic flowchart of an inspection method according to an embodiment of this application.

Embodiments of this application also propose an inspection method, as shown in FIG. 15, where the inspection method includes the following steps:

Step S10: Obtain an inspection signal.

It should be noted that the inspection signal may be generated according to the inspection need, and the inspection signal may be a signal for inspecting voltage of the battery cells under test, a signal for inspecting circuit continuity of the battery cells under test, a signal for inspecting insulation between positive electrodes of the battery cells under test, and the like. For example, if the inspection need is to inspect the voltage of the battery cells under test, the inspection signal is a signal for inspecting the voltage of the battery cells under test.

Step S20: Control, according to the inspection signal, a corresponding inspection device to connect to a test terminal corresponding to the battery cells under test.

It should be understood that when the controller receives an inspection signal, it analyzes the inspection signal to determine the specific inspection item. For example, if the inspection signal is a signal for inspecting insulation between the positive electrodes of the battery cells under test, it is determined that the specific inspection item is the test terminals corresponding to the positive electrodes of at least two battery cells under test, and the inspection device is an insulation inspection device, then the insulation inspection device is controlled to connect to the test terminal corresponding to the positive electrodes of the battery cells under test according to the inspection signal.

If the inspection signal is a voltage inspection signal, the voltage inspection device is controlled to connect to the test terminal corresponding to the positive electrode and the test terminal corresponding to the negative electrode of the battery cell under test according to the voltage inspection signal.

Step S30: Inspect, according to the inspection signal, the battery cell under test to obtain an inspection result.

As an example, when an inspection item is determined, the corresponding test path is connected, the battery cell under test can be inspected according to the corresponding inspection signal, and the inspection result is obtained, implementing automated inspection of the battery cell under test.

In the technical solution of the embodiments of this application, the connection between the corresponding inspection device and the test terminal corresponding to the battery cell under test is controlled according to the corresponding inspection signal after the inspection signal is obtained. Therefore, the corresponding inspection device can connect to the test terminal corresponding to the battery cell under test to inspect the battery cell under test to obtain the inspection result. According to the inspection signal, the corresponding inspection device can be automatically switched to, so that inspection is performed on the battery cell under test, implementing automated inspection of the battery cell under test.

In some embodiments, different inspection signals correspond to different test paths, and different switch arrays are disposed in the test paths. Therefore, the test terminal of the battery cell under test and the inspection device to be connected can be determined through the specific inspection signals, implementing rapid inspection of the battery cell under test.

Step S20 "Control, according to the inspection signal, a corresponding inspection device to connect to a test terminal corresponding to the battery cell under test" includes:

Step S201: Determine, according to the inspection signal, a connection relationship between the test terminal corresponding to the battery cell under test and the inspection device.

It should be noted that the connection between the test terminal of the battery cell under test and the inspection device varies with the inspection item, therefore the connection relationship between the battery cell under test and the corresponding inspection device can be determined based on the inspection signal. For example, if the inspection signal is an insulation inspection signal, it can be determined that the test terminal corresponding to the battery cell under test is the test terminal corresponding to the positive electrode, and the inspection device is the insulation inspection device. Then, the connection relationship between the test terminal corresponding to the positive electrode and the insulation inspection device can be determined.

Step S202: Determine, based on the connection relationship, a target switch array and a closing timing of the target switch array.

In a specific embodiment, when a connection relationship between the test terminal corresponding to the battery cell under test and the inspection device is obtained, a specific test path can be determined based on the connection relationship, and thus the switch array on the test path, that is, the target switch array, and the closing timing of the target switch array can be determined.

The closing timing of the target switch array is the closing state of the switch array corresponding to the specific inspection item.

Step S203: Control, based on the closing timing for the target switch array, the target switch array to close to connect the corresponding inspection device to the test terminal corresponding to the battery cell under test.

It should be understood that, after the closing timing of the target switch array is determined, the target switch array can be controlled to be closed so that the corresponding inspection device is connected to the test terminal corresponding to the battery cell under test.

In the technical solution of the embodiments of this application, the test terminal and the inspection device that need to be connected to the battery cell under test can be determined according to the specific inspection signal, so that the connection relationship thereof is determined. Then, the corresponding switch array and the closing timing of the switch array are determined based on the connection relationship, and the target switch array is controlled to be closed through the closing timing of the switch array. Thus, the corresponding inspection device can be controlled to be quickly connected to the test terminal corresponding to the battery cell under test, further increasing the inspection efficiency.

In some embodiments, the inspection signal includes an insulation inspection signal.

Step S20 "Control, according to the inspection signal, a corresponding inspection device to connect to a test terminal corresponding to the battery cell under test" includes:

Step S201': Control, according to the insulation inspection signal, an insulation inspection device to connect to test terminals corresponding to positive electrodes of the battery cells under test.

It should be noted that when insulation inspection is performed on the battery cell under test, the insulation inspection device in the inspection device can be controlled to connect to the test terminals corresponding to the positive electrodes of the battery cells under test according to the insulation inspection signal, so that the insulation between the positive electrodes of the battery cells under test can be performed.

In the technical solution of the embodiments of this application, the inspection signal includes the insulation inspection signal. When the obtained inspection signal is the insulation inspection signal, it can be determined that the inspection device is the insulation inspection device. Then, the insulation inspection device is controlled to connect to the test terminals corresponding to the positive electrodes of the battery cells under test. Thus, the insulation inspection device is quickly connected to the test terminal corresponding to the positive electrode of the battery cell under test according to the insulation inspection signal.

In some embodiments, step S30 "Inspect, according to the inspection signal, the battery cell under test to obtain an inspection result" includes:

Step S301: Perform, according to the insulation inspection signal, insulation inspection on the test terminals corresponding to the positive electrodes of the battery cells under test to obtain an insulation inspection result.

It should be understood that when insulation inspection needs to be performed on the battery cell under test, the insulation inspection device is connected to the test terminals corresponding to the positive electrodes of the battery cells under test, and the insulation inspection device is controlled to carry out insulation inspection of the test terminals corresponding to the positive electrodes of the battery cells under test according to the insulation inspection signal. In this way, the insulation inspection result of the battery cell under test is obtained.

The insulation inspection result may include insulation between the positive electrodes of the battery cells under test, and may also include non-insulation between the positive electrodes of the battery cells under test.

In the technical solution of the embodiments of this application, the insulation inspection can be performed on the test terminals corresponding to the positive electrodes of the battery cells under test according to the insulation inspection signal, implementing automated insulation inspection between the positive electrodes of the battery cells under test.

In some embodiments, the inspection signal includes a voltage inspection signal and a continuity inspection signal.

Step S20 "Control, according to the inspection signal, a corresponding inspection device to connect to a test terminal corresponding to the battery cell under test" includes:

Step S201": Control, according to the voltage inspection signal and the continuity inspection signal, a voltage inspection device to connect to a first test terminal corresponding to a positive electrode of the battery cell under test and a first test terminal corresponding to a negative electrode of the battery cell under test, and control, according to the continuity inspection signal, a continuity inspection device to connect to a second test terminal corresponding to the positive electrode of the battery cell under test and a second test terminal corresponding to the negative electrode of the battery cell under test.

It should be noted that voltage inspection and continuity inspection of the battery cell under test are carried out simultaneously, therefore, according to the voltage inspection signal, the voltage inspection device in the inspection device can be controlled to connect to the first test terminal corresponding to the positive electrode and the first test terminal corresponding to the negative electrode of the battery cell under test; in addition, according to the continuity inspection signal, the continuity inspection device is controlled to connect to the second test end corresponding to the positive electrode and the second test end corresponding to the negative electrode of the battery cell under test. Thus, voltage and continuity inspections of the battery cell under test can be performed simultaneously by using the voltage inspection device and the continuity inspection device.

In the technical solution of the embodiments of this application, the inspection signal includes the voltage inspection signal and the continuity inspection signal. When the obtained inspection signal is the voltage inspection signal and the continuity inspection signal, it can be determined that the inspection device is the voltage inspection device and the continuity inspection device. Then, the voltage inspection device and the continuity inspection device are controlled to be separately connected to the positive and negative electrodes corresponding to the battery cell under test. Thus, according to the voltage inspection signal and the continuity inspection signal, the voltage inspection device is quickly connected to the test terminals corresponding to the positive and negative electrodes of the battery cell under test, and the continuity inspection device is quickly connected to the test terminals corresponding to another group of positive and negative electrodes of the battery cell under test.

In some embodiments, step S30 "Inspect, according to the inspection signal, the battery cell under test to obtain an inspection result" includes:

Step S301': Perform, according to the voltage inspection signal and the continuity inspection signal, voltage inspection and continuity inspection on the battery cell under test to obtain a voltage and a continuity inspection result.

It should be noted that when voltage inspection and continuity inspection need to be performed on the battery cell under test, the voltage inspection device is connected to the first test terminal corresponding to the positive electrode and the first test terminal corresponding to the negative electrode of the battery cell under test, and the voltage inspection device is controlled to perform voltage inspection on the first test terminals corresponding to the positive and negative electrodes of the battery cell under test according to the voltage inspection signal. In this way, the voltage inspection result of the battery cell under test is obtained. The continuity inspection device is connected to the second test terminal corresponding to the positive electrode and the second test terminal corresponding to the negative electrode of the battery cell under test. In addition, according to the continuity inspection signal, the continuity inspection device is controlled to perform continuity inspection of the second test terminals corresponding to the positive and negative electrodes of the battery cell under test. In this way, the continuity inspection result of the battery cell under test is obtained.

The voltage inspection result may include a normal voltage or an abnormal voltage of the battery cell under test, and the continuity inspection result may include a circuit continuity or a circuit disconnection of the battery cell under test.

In the technical solution of the embodiments of this application, voltage inspection and continuity inspection can be performed synchronously on the test terminals corresponding to different positive and negative electrodes of the battery cells under test according to the voltage inspection signal and the continuity inspection signal, implementing synchronized voltage and continuity inspections of the battery cell under test and shortening the test time.

The foregoing embodiments are merely some embodiments of this application, and are not intended to limit the patent scope of this application. Any equivalent structural or equivalent flowchart transformations made by using the content of the specification and drawings of this application, or direct or indirect applications in other related technical fields, are included in the patent protection scope of this application in the same way.

What is claimed is:

1. An inspection circuit, comprising:

a plurality of inspection devices comprising an insulation inspection device and a voltage inspection device;

a plurality of test lines different from each other; and a plurality of pathway switching circuits, input ends of the plurality of pathway switching circuits being respectively connected to the plurality of test lines, the plurality of test lines being connected to a test terminal device corresponding to a battery cell under test, and output ends of the plurality of pathway switching circuits being respectively connected to the plurality of inspection devices;

wherein:

each of the plurality of pathway switching circuits is configured to connect, according to an inspection signal, one of the plurality of inspection devices corresponding to the inspection signal and the test terminal device corresponding to the battery cell under test;

each of the plurality of inspection devices is configured to obtain an inspection result of the battery cell under test;

the plurality of pathway switching circuits comprise an insulation test path, a voltage test path, and a multiplexing path;

an input end of the insulation test path is connected to a test terminal of the test terminal device corresponding to a positive electrode of the battery cell under test, and an output end of the insulation test path is connected to the insulation inspection device;

an input end of the voltage test path is connected to the test terminal of the test terminal device corresponding to the positive electrode of the battery cell under test and a test terminal of the test terminal device corresponding to a negative electrode of the battery cell under test, and an output end of the voltage test path is connected to the voltage inspection device; and the input end of the insulation test path and the input end of the voltage test path are simultaneously connected to the test terminal of the test terminal device corresponding to the positive electrode of the battery cell under test both through the multiplexing path.

2. The inspection circuit according to claim 1, wherein:

the battery cell under test is one of a plurality of battery cells under test;

the insulation inspection device is configured to obtain an insulation inspection result of the plurality of battery cells under test with the insulation test path connected; and the voltage inspection device is configured to obtain a voltage inspection result of the plurality of battery cells under test with the voltage test path connected.

3. The inspection circuit according to claim 2, wherein:

the insulation test path comprises a first insulation test path and a second insulation test path, and the plurality of battery cells under test comprise a first battery cell under test and a second battery cell under test, the first battery cell under test and the second battery cell under test being independent of each other;

an input end of the first insulation test path is connected to a test terminal of the test terminal device corresponding to a positive electrode of the first battery cell under test, and an output end of the first insulation test path is connected to the insulation inspection device; and an input end of the second insulation test path is connected to a test terminal of the test terminal device corresponding to a positive electrode of the second battery cell under test, and an output end of the second insulation test path is connected to the insulation inspection device.

4. The inspection circuit according to claim 3, wherein:

the plurality of pathway switching circuits further comprise a first switch array and a second switch array;

the first switch array is disposed in the first insulation test path, an input end of the first switch array is connected to the test terminal of the test terminal device corresponding to the positive electrode of the first battery cell under test, and an output end of the first switch array is connected to the insulation inspection device;

the second switch array is disposed in the second insulation test path, an input end of the second switch array is connected to the test terminal of the test terminal device corresponding to the positive electrode of the second battery cell under test, and an output end of the second switch array is connected to the insulation inspection device; and the first switch array and the second switch array are configured to be closed during insulation test of the first battery cell under test and the second battery cell under test, simultaneously connecting the test terminal of the test terminal device corresponding to the positive electrode of the first battery cell under test to the insulation inspection device and the test terminal of the test terminal device corresponding to the positive electrode of the second battery cell under test to the insulation inspection device.

5. The inspection circuit according to claim 2, wherein:

the voltage test path comprises a first voltage test path and a second voltage test path;

an input end of the first voltage test path is connected to first test terminals of the test terminal device corresponding to the positive electrodes of the plurality of battery cells under test, and an output end of the first voltage test path is connected to the voltage inspection device; and an input end of the second voltage test path is connected to first test terminals of the test terminal device corresponding to the negative electrodes of the plurality of battery cells under test, and an output end of the second voltage test path is connected to the voltage inspection device.

6. The inspection circuit according to claim 5, wherein:

the plurality of pathway switching circuits further comprise a third switch array and a fourth switch array;

the third switch array is disposed in the first voltage test path, an input end of the third switch array is connected to the first test terminals of the test terminal device corresponding to the positive electrodes of the plurality of battery cells under test, and an output end of the third switch array is connected to the voltage inspection device;

the fourth switch array is disposed in the second voltage test path, an input end of the fourth switch array is connected to the first test terminals of the test terminal device corresponding to the negative electrodes of the plurality of battery cells under test, and an output end of the fourth switch array is connected to the voltage inspection device; and the third switch array and the fourth switch array are configured to be closed during voltage test of the plurality of battery cells under test, connecting the first test terminals of the test terminal device corresponding to the positive electrodes of the plurality of battery cells under test to the voltage inspection device and the first test terminals of the test terminal device corresponding to the negative electrodes of the plurality of battery cells under test to the voltage inspection device.

7. The inspection circuit according to claim 2, wherein:

the plurality of inspection devices further comprise a continuity inspection device, and the plurality of pathway switching circuit circuits further comprise a continuity test path;

an input end of the continuity test path is connected to second test terminals of the test terminal device corresponding to the positive electrodes of the plurality of battery cells under test through the multiplexing path, the input end of the continuity test path is also connected to second test terminals of the test terminal device corresponding to the negative electrodes of the plurality of battery cells under test, and an output end of the continuity test path is connected to the continuity inspection device; and the continuity inspection device is configured to obtain a continuity inspection result of the plurality of battery cells under test with the continuity test path connected.

8. The inspection circuit according to claim 7, wherein:

the continuity test path comprises a first continuity test path and a second continuity test path;

an input end of the first continuity test path is connected to the second test terminals of the test terminal device corresponding to the positive electrodes of the plurality of battery cells under test through the multiplexing path, and an output end of the first continuity test path is connected to the continuity inspection device; and an input end of the second continuity test path is connected to the second test terminals of the test terminal device corresponding to the negative electrodes of the plurality of battery cells under test, and an output end of the second continuity test path is connected to the continuity inspection device.

9. The inspection circuit according to claim 8, wherein:

the plurality of pathway switching circuits further comprise a fifth switch array and a sixth switch array;

the fifth switch array is disposed in the first continuity test path, an input end of the fifth switch array is connected to the second test terminals of the test terminal device corresponding to the positive electrodes of the plurality of battery cells under test through the multiplexing path, and an output end of the fifth switch array is connected to the continuity inspection device;

the sixth switch array is disposed in the second continuity test path, an input end of the sixth switch array is connected to the second test terminals of the test terminal device corresponding to the negative electrodes of the plurality of battery cells under test, and an output end of the sixth switch array is connected to the continuity inspection device; and the fifth switch array and the sixth switch array are configured to be closed during continuity test of the plurality of battery cells under test, connecting the second test terminals of the test terminal device corresponding to the positive electrodes of the plurality of battery cells under test to the continuity inspection device and the second test terminals of the test terminal device corresponding to the negative electrodes of the plurality of battery cells under test to the continuity inspection device.

10. The inspection circuit according to claim 2, wherein:

the plurality of pathway switching circuits further comprise a seventh switch array;

the seventh switch array is disposed in the multiplexing path, an input end of the seventh switch array is connected to the test terminals of the test terminal device corresponding to the positive electrodes of the plurality of battery cells under test, and an output end of the seventh switch array is connected to the input end of the insulation test path, the input end of the voltage test path, and the input end of the continuity test path; and the seventh switch array is configured to be closed during inspection of the plurality of battery cells under test, connecting the test terminals of the test terminal device corresponding to the positive electrodes of the plurality of battery cells under test and a corresponding test path.

11. The inspection circuit according to claim 1, wherein:

the plurality of pathway switching circuits further comprise an inspection switching path, and the plurality of battery cells under test comprise a first group of battery cells under test and a second group of battery cells under test;

an input end of the inspection switching path is connected to test terminals of the test terminal device corresponding to the first group of battery cells under test and test terminals of the test terminal device corresponding to the second group of battery cells under test, and an output end of the inspection switching path is connected to the plurality of inspection devices;

the inspection switching path is configured to connect the test terminals of the test terminal device corresponding to the first group of battery cells under test to the plurality of inspection devices when the first group of battery cells under test are being inspected; and the inspection switching path is also configured to connect the test terminals of the test terminal device corresponding to the second group of battery cells under test to the plurality of inspection devices when the second group of battery cells under test are being inspected.

12. The inspection circuit according to claim 11, wherein:

the inspection switching path comprises a first inspection switching path and a second inspection switching path;

an input end of the first inspection switching path is connected to the test terminals of the test terminal device corresponding to the first group of battery cells under test; and an output end of the first inspection switching path is connected to the plurality of inspection devices; and an input end of the second inspection switching path is connected to the test terminals of the test terminal device corresponding to the second group of battery cells under test; and an output end of the second inspection switching path is connected to the plurality of inspection devices.

13. The inspection circuit according to claim 12, wherein:

the plurality of pathway switching circuits further comprise an eighth switch array and a ninth switch array;

the eighth switch array is disposed in the first inspection switching path, an input end of the eighth switch array is connected to the test terminals of the test terminal device corresponding to the first group of battery cells under test, and an output end of the eighth switch array is connected to the plurality of inspection devices;

the ninth switch array is disposed in the second inspection switching path, an input end of the ninth switch array is connected to the test terminals of the test terminal device corresponding to the second group of battery cells under test, and an output end of the ninth switch array is connected to the plurality of inspection devices;

the eighth switch array is configured to be closed during testing of the first group of battery cells under test, connecting the test terminals of the test terminal device corresponding to the first group of battery cells under test to the plurality of inspection devices; and the ninth switch array is configured to be closed during testing of the second group of battery cells under test, connecting the test terminals of the test terminal device corresponding to the second group of battery cells under test to the plurality of inspection devices.

14. The inspection circuit according to claim 12, wherein:

the plurality of inspection devices further comprise a first group of inspection devices and a second group of inspection devices;

the input end of the inspection switching path is connected to the test terminals of the test terminal device corresponding to the first group of battery cells under test and the test terminals of the test terminal device corresponding to the second group of battery cells under test, and the output end of the inspection switching path is connected to the first group of inspection devices and the second group of inspection devices;

the inspection switching path is configured to connect the test terminals of the test terminal device corresponding to the first group of battery cells under test to the first group of inspection devices when the first group of battery cells under test are being inspected; and the inspection switching path is also configured to connect the test terminals of the test terminal device corresponding to the second group of battery cells under test to the second group of inspection devices when the second group of battery cells under test are being inspected.

15. The inspection circuit according to claim 14, wherein:

the inspection signal comprises a first inspection signal;

the inspection switching path is also configured to connect the test terminals of the test terminal device corresponding to the first group of battery cells under test to the first group of inspection devices according to the first inspection signal; and the first group of inspection devices is configured to obtain an inspection result of the first group of battery cells under test with the test terminals of the test terminal device corresponding to the first group of battery cells under test connected to the first group of inspection devices.

16. The inspection circuit according to claim 14, wherein:

the inspection signal further comprises a second inspection signal;

the inspection switching path is also configured to connect the test terminals of the test terminal device corresponding to the second group of battery cells under test to the second group of inspection devices according to the second inspection signal; and the second group of inspection devices is configured to obtain an inspection result of the second group of battery cells under test with the test terminals of the test terminal device corresponding to the second group of battery cells under test connected to the second group of inspection devices.

17. The inspection circuit according to claim 1, further comprising:

a filter circuit;

wherein:

a first end of the filter circuit is connected to the plurality of inspection devices, and a second end of the filter circuit is connected to the plurality of pathway switching circuits; and the filter circuit is configured to perform filtering during inspection of the battery cell under test.

18. The inspection circuit according to claim 1, further comprising:

a protection circuit;

wherein:

a first end of the protection circuit is connected to the plurality of inspection devices, and a second end of the protection circuit is connected to the plurality of pathway switching circuits; and the protection circuit is configured to provide current limiting protection during inspection of the battery cell under test.

19. An inspection method performed by the inspection circuit according to claim 1, comprising:

obtaining the inspection signal;

controlling, according to the inspection signal, a corresponding one of a plurality of inspection devices to connect to a test terminal of the test terminal device corresponding to a battery cell under test; and inspecting, according to the inspection signal, the battery cell under test to obtain the inspection result.

20. An inspection circuit, comprising:

a plurality of inspection devices comprising an insulation inspection device and a voltage inspection device;

a plurality of test lines different from each other; and a plurality of pathway switching circuits, input ends of the plurality of pathway switching circuits being respectively connected to the plurality of test lines, the plurality of test lines being connected to a test terminal device corresponding to a plurality of battery cells under test, and output ends of the plurality of pathway switching circuits being respectively connected to the plurality of inspection devices;

wherein:

each of the plurality of pathway switching circuits is configured to connect, according to an inspection signal, one of the plurality of inspection devices corresponding to the inspection signal and the test terminal device corresponding to the plurality of battery cells under test;

each of the plurality of inspection devices is configured to obtain an inspection result of the plurality of battery cells under test;

the plurality of pathway switching circuits comprise an insulation test path and a voltage test path;

an input end of the voltage test path is connected to test terminals of the test terminal device corresponding to positive electrodes of the plurality of battery cells under test and test terminals of the test terminal device corresponding to negative electrodes of the plurality of battery cells under test, and an output end of the voltage test path is connected to the voltage inspection device;

the insulation test path comprises a first insulation test path and a second insulation test path, and the plurality of battery cells under test comprise a first battery cell under test and a second battery cell under test, the first battery cell under test and the second battery cell under test being independent of each other;

an input end of the first insulation test path is connected to a test terminal of the test terminal device corresponding to the positive electrode of the first battery cell under test, and an output end of the first insulation test path is connected to the insulation inspection device; and an input end of the second insulation test path is connected to a test terminal of the test terminal device corresponding to the positive electrode of the second battery cell under test, and an output end of the second insulation test path is connected to the insulation inspection device.

* * * * *